US012660575B2

(12) United States Patent
Seo et al.

(10) Patent No.: US 12,660,575 B2
(45) Date of Patent: Jun. 16, 2026

(54) SEMICONDUCTOR PACKAGE

(71) Applicant: SAMSUNG ELECTRONICS CO., LTD., Suwon-si (KR)

(72) Inventors: Ju Bin Seo, Suwon-si (KR); Seok Ho Kim, Suwon-si (KR); Kwang Jin Moon, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 370 days.

(21) Appl. No.: 18/537,960

(22) Filed: Dec. 13, 2023

(65) Prior Publication Data

US 2024/0339420 A1      Oct. 10, 2024

(30) Foreign Application Priority Data

Apr. 4, 2023      (KR) ........................ 10-2023-0044244

(51) Int. Cl.
H10P 74/00          (2026.01)
H10W 72/20          (2026.01)
          (Continued)

(52) U.S. Cl.
CPC ........... H10P 74/273 (2026.01); H10W 72/90 (2026.01); H10B 80/00 (2023.02); H10W 72/019 (2026.01); H10W 72/01935 (2026.01); H10W 72/01938 (2026.01); H10W 72/01951 (2026.01); H10W 72/252 (2026.01); H10W 72/923 (2026.01);
          (Continued)

(58) Field of Classification Search
CPC ... H10P 74/273; H10W 72/90; H10W 72/019;

H10W 72/01935; H10W 72/01938; H10W 72/01951; H10W 72/252; H10W 72/923; H10W 72/926; H10W 72/941; H10W 72/9415; H10W 72/942; H10W 72/944; H10W 72/951; H10W 72/952; H10W 72/967; H10W 74/15; H10W 80/327; H10W 90/00; H10W 90/724; H10W 90/734; H10W 90/297; H10W 90/20; H10W 40/22; H10W 74/137; H10W 72/921; H10W 72/927; H10W 20/40; H10W 20/20; H10W 90/284; H10B 80/00

See application file for complete search history.

(56) References Cited

U.S. PATENT DOCUMENTS 10,854,574 B2    12/2020    Chen et al.
10,867,943 B2    12/2020    Chen et al.
(Continued)

*Primary Examiner* — Douglas W Owens
(74) *Attorney, Agent, or Firm* — Fish & Richardson P.C.

(57) ABSTRACT

A semiconductor package includes a substrate, a semiconductor layer on the substrate, a wiring structure on the semiconductor layer, a connection pad on and connected to the wiring structure, a test pad on and connected to the wiring structure, the test and connection pads being horizontally spaced from each other, a first liner film on the wiring structure and having a first bonding pad trench, a second liner film on the first liner film and having a second bonding pad trench, a first bonding pad including a barrier layer in contact with the first liner film and a metal layer on the barrier layer, and a second bonding pad filling an inner portion of the second bonding pad trench and in contact with the second liner film, wherein the second liner film integrally covers upper surfaces of the barrier layer and metal layer.

20 Claims, 19 Drawing Sheets

(51) Int. Cl.

| | | |
|---|---|---|
| *H10W 72/90* | (2026.01) | |
| *H10W 90/00* | (2026.01) | |
| *H10B 80/00* | (2023.01) | |
| *H10W 72/00* | (2026.01) | |
| *H10W 74/15* | (2026.01) | |
| *H10W 80/00* | (2026.01) | |

(52) U.S. Cl.

CPC ........ *H10W 72/926* (2026.01); *H10W 72/941* (2026.01); *H10W 72/9415* (2026.01); *H10W 72/942* (2026.01); *H10W 72/944* (2026.01); *H10W 72/951* (2026.01); *H10W 72/952* (2026.01); *H10W 72/967* (2026.01); *H10W 74/15* (2026.01); *H10W 80/327* (2026.01); *H10W 90/00* (2026.01); *H10W 90/724* (2026.01); *H10W 90/734* (2026.01)

(56) References Cited

U.S. PATENT DOCUMENTS

| | | | |
|---|---|---|---|
| 10,886,245 B2 | 1/2021 | Chen et al. | |
| 11,018,110 B2 | 5/2021 | Hirata et al. | |
| 11,289,438 B2 | 3/2022 | Hong et al. | |
| 11,355,404 B2 | 6/2022 | Gao et al. | |
| 2020/0243466 A1* | 7/2020 | Kim | H10W 72/90 |
| 2022/0037283 A1 | 2/2022 | De Vos et al. | |
| 2022/0189905 A1 | 6/2022 | Sawada et al. | |
| 2023/0060360 A1* | 3/2023 | Seo | H10P 74/273 |
| 2023/0138813 A1* | 5/2023 | Seo | H10W 20/20 |
| | | | 257/774 |
| 2023/0282528 A1* | 9/2023 | Seo | H10P 74/273 |

* cited by examiner

SEMICONDUCTOR PACKAGE

CROSS-REFERENCE TO RELATED APPLICATION

This application claims priority from Korean Patent Application No. 10-2023-0044244, filed on Apr. 4, 2023, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor package.

2. Description of the Related Art

In accordance with the rapid development of the electronic industry and user's needs, electronic devices have become more compact, lightweight, and multifunctional, and semiconductor packages used in the electronic devices have also been required to become compact, lightweight, and multifunctional. To this end, by integrating two or more types of semiconductor chips into one semiconductor package, it has been possible to increase a capacity of the semiconductor package and allow the semiconductor package to become multifunctional while significantly decreasing a size of the semiconductor package.

In order to achieve the increase in capacity of the semiconductor package, semiconductor chips may be stacked using a chip on wafer (CoW) method or a die to wafer (D2 W) method. The CoW method may refer to a method of stacking the semiconductor chips on a wafer (or a semiconductor chip) using connection members, e.g., bumps or solders. In contrast, the D2 W method may refer to a method of stacking the semiconductor chips on a wafer (or a semiconductor chip) through pad-to-pad bonding, bonding using an anisotropic conductive film (ACF), or the like.

SUMMARY

A semiconductor package according to some exemplary embodiments may include a first semiconductor substrate having a first surface and a second surface opposing the first surface, a first semiconductor element layer disposed on the second surface of the first semiconductor substrate, a first wiring structure disposed on the first semiconductor element layer, a first connection pad disposed on the first wiring structure and connected to the first wiring structure, a first test pad disposed on the first wiring structure, connected to the first wiring structure, and spaced apart from the first connection pad in a horizontal direction, a first liner film disposed on the first wiring structure and having a first bonding pad trench formed therein, a second liner film disposed on the first liner film and having a second bonding pad trench formed therein, a first front bonding pad including a barrier layer formed along sidewalls and a bottom surface of the first bonding pad trench and in contact with the first liner film and a first metal layer disposed on the barrier layer, and a second front bonding pad filling an inner portion of the second bonding pad trench and in contact with the second liner film, wherein the second liner film integrally covers an upper surface of the barrier layer and an upper surface of the first metal layer.

A semiconductor package according to some other exemplary embodiments may include a semiconductor substrate having a first surface and a second surface opposing the first surface, a semiconductor element layer disposed on the second surface of the semiconductor substrate, a wiring structure disposed on the semiconductor element layer, a connection pad disposed on the wiring structure and connected to the wiring structure, a test pad disposed on the wiring structure, connected to the wiring structure, and spaced apart from the connection pad in a horizontal direction, a first liner film disposed on the wiring structure and having a dummy pad trench and a first bonding pad trench formed therein, the dummy pad trench exposing the test pad and the first bonding pad trench exposing the connection pad, a second liner film disposed on the first liner film so as to cover an upper surface of the first liner film and having a second bonding pad trench formed therein, a first front bonding pad formed inside the first bonding pad trench and in contact with the first liner film, a second front bonding pad formed inside the second bonding pad trench and in contact with the second liner film, and a dummy pad formed inside the dummy pad trench, wherein an upper surface of the first front bonding pad includes a first area in contact with the second liner film and a second area in contact with the second front bonding pad, and entirety of an upper surface of the dummy pad is in contact with the second liner film.

A semiconductor package according to some other exemplary embodiments may include a base substrate, and a plurality of semiconductor chips sequentially stacked on the base substrate, wherein each of the semiconductor chips includes a semiconductor substrate including a first surface facing an upper surface of the base substrate and a second surface opposing the first surface, a semiconductor element layer and a wiring structure sequentially stacked on the first surface of the semiconductor substrate, a connection pad and a test pad each connected to the wiring structure and each exposed from the wiring structure, a first liner film disposed on the wiring structure, a second liner film disposed on the first liner film so as to cover an upper surface of the first liner film, a first front bonding pad disposed within the first liner film, connected to the connection pad, and not connected to the test pad, a second front bonding pad disposed within the second liner film, connected to the connection pad, and not connected to the test pad, a back bonding pad disposed on the second surface of the semiconductor substrate, and a through via penetrating through the semiconductor substrate to connect the wiring structure and the back bonding pad to each other, and only a portion of an upper surface of the first front bonding pad is in contact with the second liner film.

BRIEF DESCRIPTION OF THE DRAWINGS

Features will become apparent to those of skill in the art by describing in detail exemplary embodiments with reference to the attached drawings, in which:

FIG. 2 is an enlarged view of area A of FIG. 1;

FIG. 3 is an enlarged view of a semiconductor package according to some other exemplary embodiments of the present disclosure;

FIG. 4 is an enlarged view of a semiconductor package according to some other exemplary embodiments of the present disclosure;

FIG. 18 is a schematic cross-sectional view of a semiconductor package according to some other exemplary embodiments of the present disclosure.

DETAILED DESCRIPTION

Hereinafter, a semiconductor package according to some exemplary embodiments of the present disclosure will be described with reference to FIGS. 1 and 2.

Figure 1:
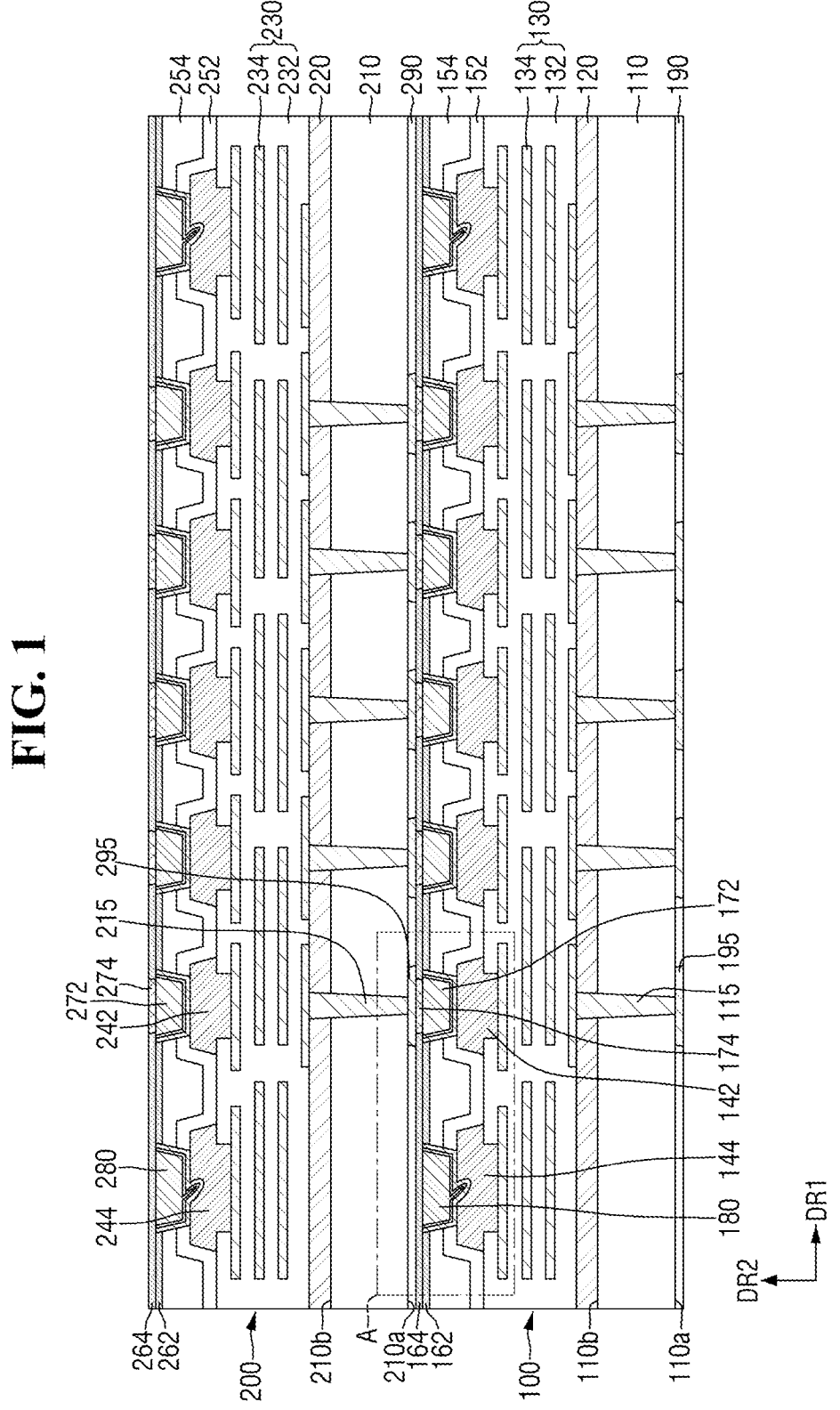
FIG. 1 is a schematic cross-sectional view of a semiconductor package according to some exemplary embodiments of the present disclosure.

FIG. 1 is a schematic cross-sectional view of a semiconductor package according to some exemplary embodiments of the present disclosure. FIG. 2 is an enlarged view of area A of FIG. 1.

Figure 2:
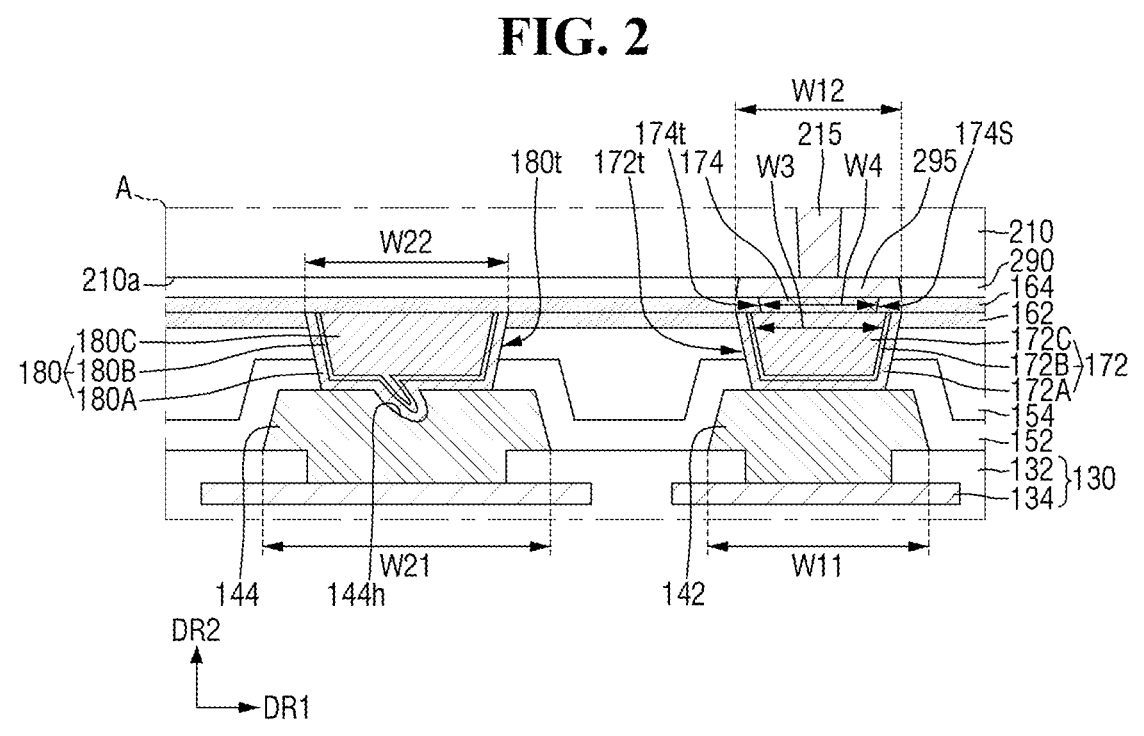

Referring to FIGS. 1 and 2, a semiconductor package according to some exemplary embodiments of the present disclosure may include a first semiconductor chip 100 and a second semiconductor chip 200.

Each of the first semiconductor chip 100 and the second semiconductor chip 200 may be an integrated circuit (IC) having a plurality of semiconductor elements integrated into one chip. For example, each of the first semiconductor chip 100 and the second semiconductor chip 200 may be an application processor (AP), e.g., a central processing unit (CPU), a graphic processing unit (GPU), a field-programmable gate array (FPGA), a digital signal processor, an encryption processor, a microprocessor, a microcontroller, or an application-specific integrated circuit (ASIC). In another example, each of the first semiconductor chip 100 and the second semiconductor chip 200 may be a volatile memory, e.g., a dynamic random access memory (DRAM) or a static random access memory (SRAM), or may be a non-volatile memory, e.g., a flash memory, a phase-change random access memory (PRAM), a magnetoresistive random access memory (MRAM), a ferroelectric random access memory (FeRAM), or a resistive random access memory (RRAM). In some exemplary embodiments, the first semiconductor chip 100 and the second semiconductor chip 200 may form a multi-chip semiconductor package, e.g., a high bandwidth memory (HBM).

The first semiconductor chip 100 may include a first semiconductor substrate 110, first through vias 115, a first semiconductor element layer 120, a first wiring structure 130, first connection pads 142, first test pads 144, a first passivation film 152, a first interlayer insulating film 154, a first liner film 162, a second liner film 164, first front bonding pads 172, second front bonding pads 174, first dummy pads 180, a first back insulating film 190, and first back bonding pads 195.

For example, the first semiconductor substrate 110 may be bulk silicon or silicon-on-insulator (SOI). In another example, the first semiconductor substrate 110 may be a silicon substrate or may include other materials, e.g., silicon germanium, silicon germanium on insulator (SGOI), indium antimonide, a lead tellurium compound, indium arsenide, indium phosphide, gallium arsenide, or gallium antimonide.

The first semiconductor substrate 110 may have a first surface 110*a* and a second surface 110*b* opposing each other. The second surface 110*b* of the first semiconductor substrate 110 may be an active surface on which a first semiconductor element layer 120 to be described later is formed. Hereinafter, the second surface 110*b* of the first semiconductor substrate 110 may be referred to as a front side of the first semiconductor substrate 110, and the first surface 110*a* of the first semiconductor substrate 110 may be referred to as a back side of the first semiconductor substrate 110.

The first semiconductor element layer 120 may be disposed on (e.g., directly on) the second surface 110*b* of the first semiconductor substrate 110. The first semiconductor element layer 120 may include various microelectronic elements, e.g., a metal-oxide-semiconductor field effect transistor (MOSFET) (e.g., such as a complementary metal-oxide-semiconductor (CMOS) transistor), a system large scale integration (LSI), a flash memory, a dynamic random access memory (DRAM), a static random access memory (SRAM), an electrically erasable programmable read-only memory (EEPROM), a phase-change random access memory (PRAM), a magnetoresistive random access memory (MRAM), a resistive random access memory (RERAM), an image sensor (e.g., such as a CMOS imaging sensor (CIS)), a micro-electro-mechanical system (MEMS), an active element, and a passive element.

The first wiring structure 130 may cover the first semiconductor element layer 120. The first wiring structure 130 may be electrically connected to the first semiconductor element layer 120. For example, the first wiring structure 130 may include a first inter-wiring insulating film 132 covering the first semiconductor element layer 120, and first wiring patterns 134 disposed within the first inter-wiring insulating film 132. The first wiring patterns 134 may be formed in a multilayer structure and electrically connected to the first semiconductor element layer 120. A width, an arrangement, a number of layers, and the like, of first wiring patterns 134 are only examples and are not limited to those illustrated in FIG. 1.

For example, the first wiring pattern 134 may include a conductive film and a barrier film disposed between the conductive film and the first inter-wiring insulating film 132. The conductive film may include, e.g., at least one of tungsten (W), aluminum (Al), and copper (Cu). The barrier film may include, e.g., at least one of titanium (Ti), titanium nitride (TiN), tantalum (Ta), and tantalum nitride (TaN).

The first through via 115 may penetrate through the first semiconductor substrate 110 in a vertical direction DR2. The first through via 115 may be electrically connected to the first wiring structure 130. For example, the first through via 115 may penetrate through the first semiconductor substrate 110 and the first semiconductor element layer 120, and may be connected to the lowermost layer of the first wiring pattern 134. For example, the first through via 115 may include at least one of Cu, Cu alloys (e.g., CuSn, CuMg, CuNi, CuZn, CuPd, CuAu, CuRe, and CuW), W, W alloys, Ni, Ru, and Co.

The first connection pad 142 and the first test pad 144 may be spaced apart from each other in a horizontal direction DR1, and may be disposed on the first wiring structure 130. Here, the horizontal direction DR1 and the vertical direction DR2 may be defined as directions perpendicular to each other. In addition, the horizontal direction DR1 may be defined as a direction parallel to the second surface 110*b* of the first semiconductor substrate 110, and the vertical direction DR2 may be defined as a direction perpendicular to the second surface 110*b* of the first semiconductor substrate 110.

Each of the first connection pad 142 and the first test pad 144 may be electrically connected to the first wiring structure 130. For example, at least a portion of the first connection pad 142 may be disposed inside the first inter-wiring insulating film 132. The first connection pad 142 disposed inside the first inter-wiring insulating film 132 may be connected to the first wiring pattern 134, e.g., to an upper-most layer of the first wiring pattern 134. For example, at least a portion of the first test pad 144 may be disposed inside the first inter-wiring insulating film 132. The first test pad 144 disposed inside the first inter-wiring insulating film 132 may be connected to the first wiring pattern 134, e.g., to an uppermost layer of the first wiring pattern 134.

For example, a plurality of first test pads 144 may be disposed on both sides of the first connection pads 142, e.g., the plurality of first test pads 144 may be disposed around a periphery of a group of adjacent first connection pads 142. Arrangements, numbers, and the like, of the first connection pads 142 and first test pads 144 are only examples, and are not limited to those illustrated in FIG. 1. For example, as illustrated in FIG. 1, the first wiring pattern 134 connected to the first connection pad 142 and the first wiring pattern 134 connected to the first test pad 144 may not be connected to each other. In another example, the first wiring pattern 134 connected to the first connection pad 142 and the first wiring pattern 134 connected to the first test pad 144 may be electrically connected to each other.

Each of the first connection pad 142 and the first test pad 144 may include, e.g., aluminum (Al). In some other exemplary embodiments, each of the first connection pad 142 and the first test pad 144 may include, e.g., at least one of tungsten (W) and copper (Cu). For example, an upper surface of the first test pad 144 may include a groove 144_h_. The groove 144_h_ of the first test pad 144 may be formed in a test process for the first semiconductor chip 100.

For example, each of the first connection pad 142 and the first test pad 144 may protrude from the first wiring structure 130 in the vertical direction DR2, e.g., each of the first connection pad 142 and the first test pad 144 may protrude above the upper surface of the first wiring structure 130. For example, an upper surface of the first connection pad 142 and the upper surface of the first test pad 144 may be formed at a level above an upper surface of the first wiring structure 130, e.g., relative to the first surface 110_a_ of the substrate 110. For example, a width W11 of the first connection pad 142 in the horizontal direction DR1 may be smaller than a width W21 of the first test pad 144 in the horizontal direction DR1, e.g., each of a maximal width W11 and a minimal width of the first connection pad 142 may be smaller than a corresponding one of a maximal width W21 and a minimal width of the first test pad 144.

The first passivation film 152 may be disposed on the first wiring structure 130, the first connection pad 142, and the first test pad 144. For example, the first passivation film 152 may be conformally disposed along profiles of the first wiring structure 130, the first connection pad 142, and the first test pad 144. The first passivation film 152 may protect the first connection pad 142 and the first test pad 144 from external impact or moisture. The first passivation film 152 may include, e.g., at least one of silicon oxide, silicon nitride, and silicon oxynitride.

The first interlayer insulating film 154 may be disposed on the first passivation film 152. The first interlayer insulating film 154 may cover an upper surface of the first passivation film 152. For example, the first interlayer insulating film 154 may include a planarized upper surface. The first interlayer insulating film 154 may include, e.g., at least one of silicon oxide, silicon nitride, and silicon oxynitride. For example, the first interlayer insulating film 154 may include tetraethyl orthosilicate (TEOS).

The first liner film 162 may be disposed on the first interlayer insulating film 154. The first liner film 162 may cover an, e.g., entire, upper surface of the first interlayer insulating film 154. For example, the first liner film 162 may conformally extend along the upper surface of the first interlayer insulating film 154.

A first bonding pad trench 172_t_ may be formed in the first liner film 162. The first bonding pad trench 172_t_ may include sidewalls penetrating through the first liner film 162, the first interlayer insulating film 154, and the first passivation film 152 in the vertical direction DR2, and a bottom surface connected to the sidewalls and exposing the first connection pad 142.

The first liner film 162 may include, e.g., silicon nitride (SiN). For example, the first liner film 162 may include a material different from that of the first interlayer insulating film 154. For example, the first interlayer insulating film 154 may include silicon oxide, and the first liner film 162 may include silicon nitride.

The first front bonding pad 172 may be disposed on the first connection pad 142. The first front bonding pad 172 may penetrate through the first passivation film 152, the first interlayer insulating film 154, and the first liner film 162 in the vertical direction DR2, and may be connected to the first connection pad 142. Portions of sidewalls of the first front bonding pad 172 may be surrounded by the first liner film 162, e.g., the first liner film 162 may directly contact and surround an entire perimeter of an upper portion of the first front bonding pad 172.

The first front bonding pad 172 may be formed inside the first bonding pad trench 172_t_. The first front bonding pad 172 may include first to third metal layers 172A, 172B, and 172C sequentially formed inside the first bonding pad trench 172_t_.

The first metal layer 172A may be formed, e.g., conformally, along the sidewalls and the bottom surface of the first bonding pad trench 172_t_. Upper portions of sidewalls of the first metal layer 172A may be in contact (e.g., direct contact) with the first liner film 162. The second metal layer 172B may be formed, e.g., conformally, on the first metal layer 172A along the sidewalls and the bottom surface of the first bonding pad trench 172_t_. The third metal layer 172C may be disposed on the second metal layer 172B so as to fill (e.g., completely fill) an inner portion of the first bonding pad trench 172_t_.

For example, an upper surface of the first front bonding pad 172 may be formed on the same plane as an upper surface of the first liner film 162, e.g., upper surfaces of the first front bonding pad 172 and the first liner film 162 may be coplanar. For example, a width W12 of the first front bonding pad 172 in the horizontal direction DR1 may be smaller than the width W11 of the first connection pad 142 in the horizontal direction DR1, e.g., a maximal width W12 of the first front bonding pad 172 may be smaller than the maximal width W11 of the first connection pad 142.

The first front bonding pad 172 may include different metal materials. For example, the first metal layer 172A may include tantalum (Ta), the second metal layer 172B may include copper (Cu), and the third metal layer 172C may include copper (Cu). The first metal layer 172A may be a barrier layer. The second metal layer 172B may be a copper seed layer, and the third metal layer 172C may be a copper plating layer.

The first dummy pad 180 may be disposed on the first test pad 144. The first dummy pad 180 may penetrate through the first passivation film 152, the first interlayer insulating film 154, and the first liner film 162 in the vertical direction DR2, and may be connected to the first test pad 144. Portions of sidewalls of the first dummy pad 180 may be surrounded by the first liner film 162, e.g., the first liner film 162 may directly contact and surround an entire perimeter of an upper portion of the first dummy pad 180.

A first dummy pad trench 180*t* may be formed in the first liner film 162. The first dummy pad trench 180*t* may include sidewalls penetrating through the first liner film 162, the first interlayer insulating film 154, and the first passivation film 152 in the vertical direction DR2, and a bottom surface connected to the sidewalls and exposing the first test pad 144.

For example, an upper surface of the first dummy pad 180 may be formed on the same plane as the upper surface of the first liner film 162, e.g., upper surfaces of the first dummy pad 180 and the first liner film 162 may be coplanar. In addition, the upper surface of the first dummy pad 180 may be formed on the same plane as the upper surface of the first front bonding pad 172, e.g., upper surfaces of the first dummy pad 180 and the first front bonding pad 172 may be coplanar. For example, a width W22 of the first dummy pad 180 in the horizontal direction DR1 may be smaller than the width W21 of the first test pad 144 in the horizontal direction DR1, e.g., a maximal width W22 of the first dummy pad 180 may be smaller than the maximal width W21 of the first test pad 144 in the horizontal direction DR1. In addition, the width W22 of the first dummy pad 180 in the horizontal direction DR1 may be greater than the width W12 of the first front bonding pad 172 in the horizontal direction DR1.

The first dummy pad 180 may be formed inside the first dummy pad trench 180*t*. The first dummy pad 180 may include first to third dummy metal layers 180A, 180B, and 180C sequentially formed in the first dummy pad trench 180*t*.

The first dummy metal layer 180A may be formed, e.g., conformally, along the sidewalls and the bottom surface of the first dummy pad trench 180*t*. Upper portions of sidewalls of the first dummy metal layer 180A may be in contact (e.g., direct contact) with the first liner film 162. The second dummy metal layer 180B may be formed, e.g., conformally, on the first dummy metal layer 180A along the sidewalls and the bottom surface of the first dummy pad trench 180*t*. The third dummy metal layer 180C may be disposed on the second dummy metal layer 180B so as to fill (e.g., completely fill) an inner portion of the first dummy pad trench 180*t*.

For example, the first dummy pad 180 may include the same material as the first front bonding pad 172. For example, the first dummy metal layer 180A may include tantalum (Ta), the second dummy metal layer 180B may include copper (Cu), and the third dummy metal layer 180C may include copper (Cu). The first dummy metal layer 180A may be a barrier layer. The second dummy metal layer 180B may be a copper seed layer, and the third dummy metal layer 180C may be a copper plating layer.

The second liner film 164 may be disposed on the first liner film 162. The second liner film 164 may cover the, e.g., entire, upper surface of the first liner film 162. For example, the second liner film 164 may conformally extend along the upper surface of the first liner film 162. The second liner film 164 may include, e.g., silicon carbonitride (SiCN).

The second liner film 164 may integrally cover an upper surface of the first metal layer 172A and an upper surface of the second metal layer 172B, e.g., the second liner film 164 may extend continuously to completely cover upper surfaces of the first metal layer 172A and the second metal layer 172B. The second liner film 164 may be in contact with the upper surface of the first metal layer 172A and the upper surface of the second metal layer 172B.

Only a portion of the upper surface of the first front bonding pad 172 may be in contact with the second liner film 164. In detail, the entirety of the upper surfaces of the first and second metal layers 172A and 172B and only a portion of an upper surface of the third metal layer 172C may be in contact with the second liner film 164. That is, the upper surface of the first front bonding pad 172 may include a first area in contact with the second liner film 164 and a second area in contact with the second front bonding pad 174.

As further illustrated in FIG. 2, the entirety of the upper surface of the first dummy pad 180 may be in contact (e.g., direct contact) with the second liner film 164. In detail, the entirety of upper surfaces of the first to third dummy metal layers 180A, 180B, and 180C may be in contact (e.g., direct contact) with the second liner film 164.

A second bonding pad trench 174*t* may be formed in the second liner film 164. The second bonding pad trench 174*t* may include sidewalls penetrating through the second liner film 164 in the vertical direction DR2, and a bottom surface connected to the sidewalls and exposing the upper surface of the first front bonding pad 172, e.g., the upper surface of the third metal layer 172C.

The second front bonding pad 174 may be disposed on the first front bonding pad 172, e.g., the second front bonding pad 174 may be directly on the third metal layer 172C. That is, the second front bonding pad 174 may not be disposed on the first test pad 144 and the first dummy pad 180.

The second front bonding pad 174 may fill an inner portion of the second bonding pad trench 174*t* and may be connected to the first front bonding pad 172. Sidewalls 174S of the second front bonding pad 174 may be surrounded by the second liner film 164 and may be in contact (e.g., direct contact) with the second liner film 164.

Referring to FIG. 2, the sidewalls 174S of the second front bonding pad 174 may be misaligned with the third metal layer 172C in the vertical direction DR2, e.g., the sidewalls 174S of the second front bonding pad 174 may be horizontally spaced apart from sidewalls of the third metal layer 172C in the horizontal direction DR1. A width W3 of the third metal layer 172C in the horizontal direction DR1 may be greater than a width W4 of the second front bonding pad 174 in the horizontal direction DR1, e.g., a width of the upper surface of the third metal layer 172C in the horizontal direction DR1 may be greater than a width of the bottom surface of the second front bonding pad 174 in the horizontal direction DR1.

For example, an upper surface of the second front bonding pad 174 may be formed on the same plane as (e.g., coplanar with) an upper surface of the second liner film 164. The width W4 of the second front bonding pad 174 in the horizontal direction DR1 may be different from the width W12 of the first front bonding pad 172 in the horizontal direction DR1. For example, the width W4 of the second front bonding pad 174 in the horizontal direction DR1 may be smaller than the width W12 of the first front bonding pad 172 in the horizontal direction DR1.

For example, the second front bonding pad 174 may include copper (Cu). In this case, the second front bonding pad 174 may be formed by physical vapor deposition (PVD) unlike the third metal layer 172C.

The first back insulating film 190 may be disposed on the first surface 110*a* of the first semiconductor substrate 110. The first back insulating film 190 may cover the first surface 110*a* of the first semiconductor substrate 110. The first back insulating film 190 may include, e.g., at least one of silicon oxide, silicon nitride, and silicon oxynitride. In some exemplary embodiments, the first back insulating film 190 may include a silicon oxide film.

The first back bonding pad 195 may be formed on the first surface 110a of the first semiconductor substrate 110. Sidewalls of the first back bonding pad 195 may be surrounded by the first back insulating film 190. For example, a lower surface of the first back bonding pad 195 may be formed on the same plane as (e.g., coplanar with) a lower surface of the first back insulating film 190. The first back bonding pad 195 may be electrically connected to the first through via 115. The first back bonding pad 195 may include, e.g., at least one of tungsten (W), aluminum (Al), and copper (Cu).

The second semiconductor chip 200 may include a second semiconductor substrate 210, second through vias 215, a second semiconductor element layer 220, a second wiring structure 230, second connection pads 242, second test pads 244, a second passivation film 252, a second interlayer insulating film 254, a third liner film 262, a fourth liner film 264, third front bonding pads 272, fourth front bonding pads 274, second dummy pads 280, a second back insulating film 290, and second back bonding pads 295.

The second semiconductor chip 200 may be disposed on the first semiconductor chip 100. The second semiconductor substrate 210 may include a first surface 210a facing the first semiconductor chip 100 and a second surface 210b opposing the first surface 210a. The second back insulating film 290 and the second back bonding pad 295 disposed on the first surface 210a of the second semiconductor substrate 210 may be bonded to the first semiconductor chip 100.

The second semiconductor chip 200 may be bonded to the first semiconductor chip 100 by a die to wafer (D2 W) method. For example, the second back bonding pad 295 of the second semiconductor chip 200 may be bonded (e.g., directly bonded) to the second front bonding pad 174 of the first semiconductor chip 100. Thus, the second semiconductor chip 200 may be electrically connected to the first semiconductor chip 100. The first test pad 144 of the first semiconductor chip 100 may be electrically insulated from the second semiconductor chip 200.

In some exemplary embodiments, the first semiconductor chip 100 and the second semiconductor chip 200 may be bonded to each other by a hybrid bonding method. The hybrid bonding method refers to a bonding method of simultaneously bonding a metal and an insulating film (e.g., oxide) or a metal and a polymer to each other. For example, the second front bonding pad 174 may be attached (e.g., directly attached) to the second back bonding pad 295, and the second liner film 164 may be attached (e.g., directly attached) to the second back insulating film 290. For example, the first semiconductor chip 100 and the second semiconductor chip 200 may be bonded to each other by a copper-oxide hybrid bonding method.

In some other exemplary embodiments, the first semiconductor chip 100 and the second semiconductor chip 200 may be bonded to each other by a metal bonding method. For example, the second front bonding pad 174 may be attached to the second back bonding pad 295, and the second liner film 164 may be spaced apart from the second back insulating film 290. As an example, the first semiconductor chip 100 and the second semiconductor chip 200 may be bonded to each other by a copper to copper bonding method.

The second semiconductor element layer 220 and the second wiring structure 230 may be sequentially stacked on the second surface 210b of the second semiconductor substrate 210. The second wiring structure 230 may include second wiring patterns 234 and a second inter-wiring insulating film 232 surrounding the second wiring patterns 234. The second through via 215 may penetrate through the second semiconductor substrate 210 and the second semiconductor element layer 220 in the vertical direction DR2. The second through via 215 may electrically connect the second back bonding pad 295 and the second wiring pattern 234 to each other. That is, the second wiring pattern 234 may be electrically connected to the second front bonding pad 174 through the second back bonding pad 295 and the second through via 215.

The second connection pads 242, the second test pads 244, the second passivation film 252, the second interlayer insulating film 254, the third liner film 262, the fourth liner film 264, the third front bonding pads 272, the fourth front bonding pads 274, and the second dummy pads 280 may be disposed on the second wiring structure 230. Each of the second connection pad 242, the second test pad 244, the second passivation film 252, the second interlayer insulating film 254, the third liner film 262, the fourth liner film 264, the third front bonding pad 272, the fourth front bonding pad 274, and the second dummy pad 280 may have the same structure as each of the first connection pad 142, the first test pad 144, the first passivation film 152, the first interlayer insulating film 154, the first liner film 162, the second liner film 164, the first front bonding pad 172, the second front bonding pad 174, and the first dummy pad 180, respectively. Accordingly, a detailed description of such components will be omitted.

As semiconductor packages have been continuously required to become compact, lightweight, and multifunctional, there were limitations in stacking semiconductor chips only by a chip on wafer (CoW) method. For example, in a case of connection members, e.g., bumps or solders, applied to the CoW method, it was difficult to secure required thermal characteristics due to limitations in smooth heat dissipation.

In contrast, the semiconductor package according to some exemplary embodiments of the present disclosure has improved thermal characteristics because semiconductor chips (e.g., the first semiconductor chip 100 and the second semiconductor chip 200) may be bonded to each other by the D2 W method. For example, as described above, the second front bonding pad 174 of the first semiconductor chip 100 may be bonded (e.g., directly bonded) to the second back bonding pad 295 of the second semiconductor chip 200. In addition, each of the first front bonding pad 172, the second front bonding pad 174, and the second back bonding pad 295 may include copper (Cu) having lower thermal resistance than the connection member, e.g., the bump or the solder.

In addition, by integrally covering the upper surfaces of the first metal layer 172A and the second metal layer 172B of the first front bonding pad 172 with the second liner film 164 made of a bonding dielectric material, it is possible to minimize a phenomenon in which the first metal layer 172A and the second metal layer 172B including different metal materials are separated from each other. Accordingly, reliability of the semiconductor package may be improved.

Figure 3:
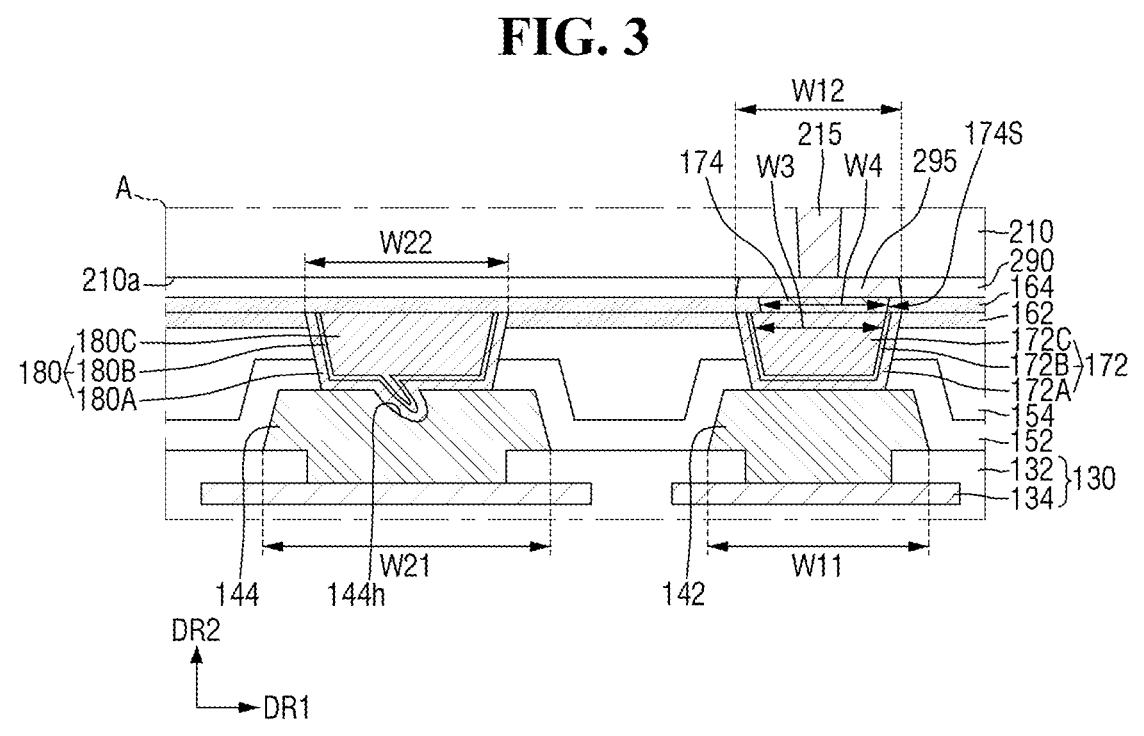

FIG. 3 is an enlarged view for describing a semiconductor package according to some other exemplary embodiments of the present disclosure. Contents different from those of the semiconductor package illustrated in FIG. 2 will be mainly described.

Referring to FIG. 3, in the vertical direction DR2, one of the sidewalls 174S of the second front bonding pad 174 may be misaligned with a sidewall of the third metal layer 172C, and the other of the sidewalls 174S of the second front bonding pad 174 may be aligned with a sidewall of the third metal layer 172C. A width W4 of the second front bonding pad 174 in the horizontal direction DR1 illustrated in FIG. 3 may be greater than the width W4 of the second front bonding pad 174 in the horizontal direction DR1 illustrated in FIG. 2.

Figure 4:
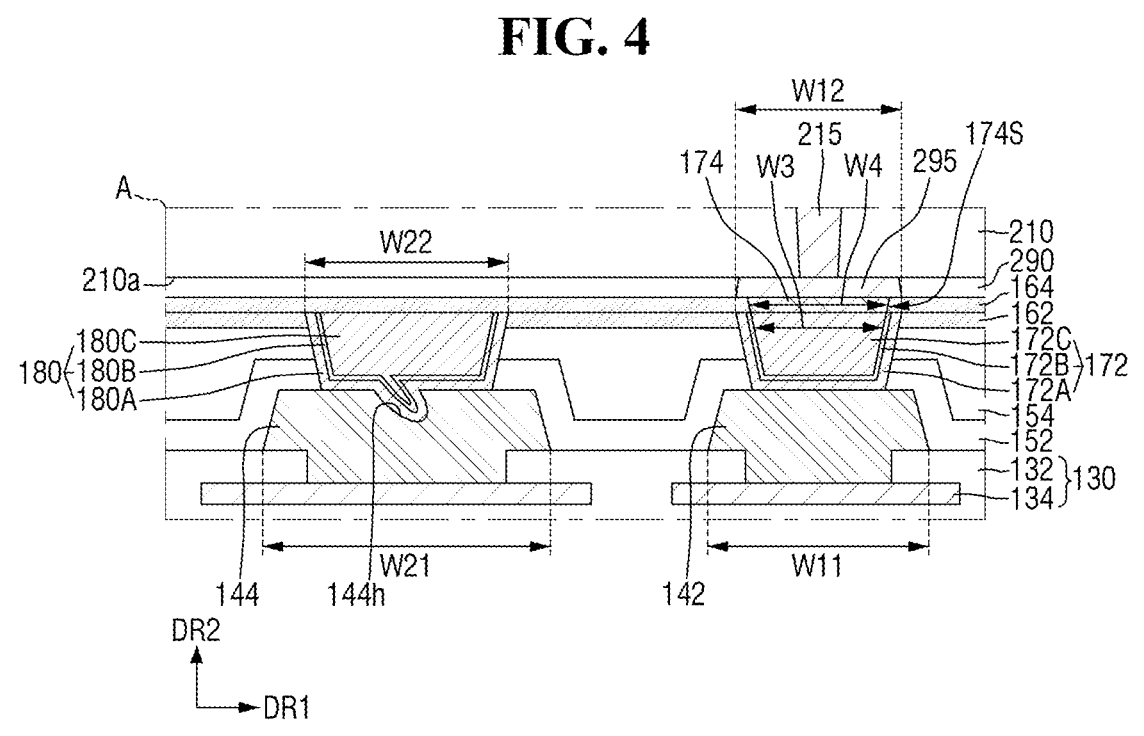

FIG. 4 is an enlarged view for describing a semiconductor package according to some other exemplary embodiments of the present disclosure. Contents different from those of the semiconductor package illustrated in FIG. 2 will be mainly described.

Referring to FIG. 4, in the vertical direction DR2, both sidewalls 174S of the second front bonding pad may be aligned with sidewalls of the third metal layer 172C. A width W4 of the second front bonding pad 174 in the horizontal direction DR1 illustrated in FIG. 4 may be greater than the widths W4 of the second front bonding pads 174 in the horizontal direction DR1 illustrated in FIGS. 2 and 3.

Hereinafter, a method of manufacturing a semiconductor package according to some exemplary embodiments of the present disclosure will be described with reference to FIGS. 5 to 17. FIGS. 5 to 17 are cross-sectional views of stages in a method of manufacturing a semiconductor package according to some exemplary embodiments of the present disclosure.

Figure 5:
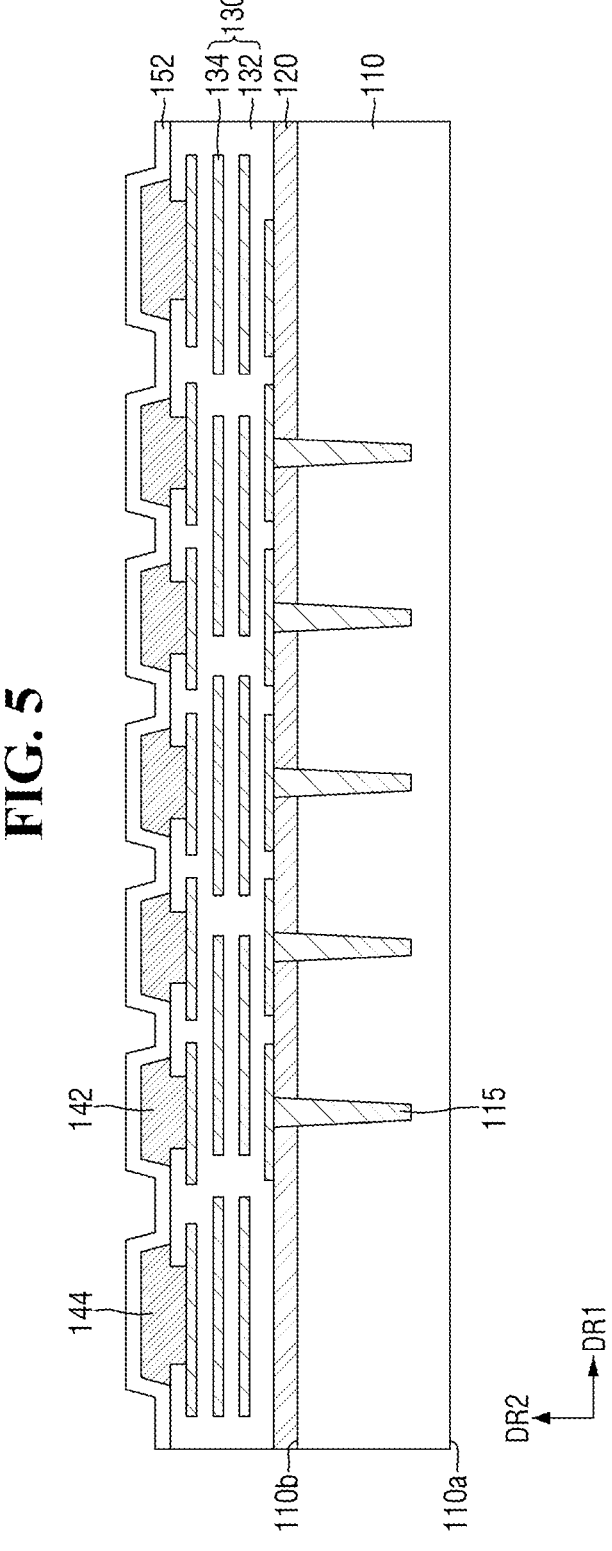
FIGS. 5 to 17 are stages in a method of manufacturing a semiconductor package according to some exemplary embodiments of the present disclosure.

Referring to FIG. 5, each of the first through vias 115, the first semiconductor element layer 120, the first wiring structure 130, the first connection pads 142, the test pads 144, and the first passivation film 152 may be formed on the first semiconductor substrate 110.

For example, the first semiconductor substrate 110 including the first surface 110a and the second surface 110b may be provided. The first semiconductor element layer 120 may be formed on the second surface 110b of the first semiconductor substrate 110. The first through via 115 may be formed in the first semiconductor substrate 110 and the first semiconductor element layer 120. The first wiring structure 130 may be formed on the first semiconductor element layer 120. The first connection pad 142 and the first test pad 144 may be spaced apart from each other in the horizontal direction DR1 and may be formed on the first wiring structure 130.

Subsequently, the first passivation film 152 may be formed on the first wiring structure 130, the first connection pad 142, and the first test pad 144. The first passivation film 152 may conformally extend along the profiles of the first wiring structure 130, the first connection pad 142, and the first test pad 144. The first passivation film 152 may be formed by, e.g., a high density plasma chemical vapor deposition (HDP CVD) process.

Figure 6:
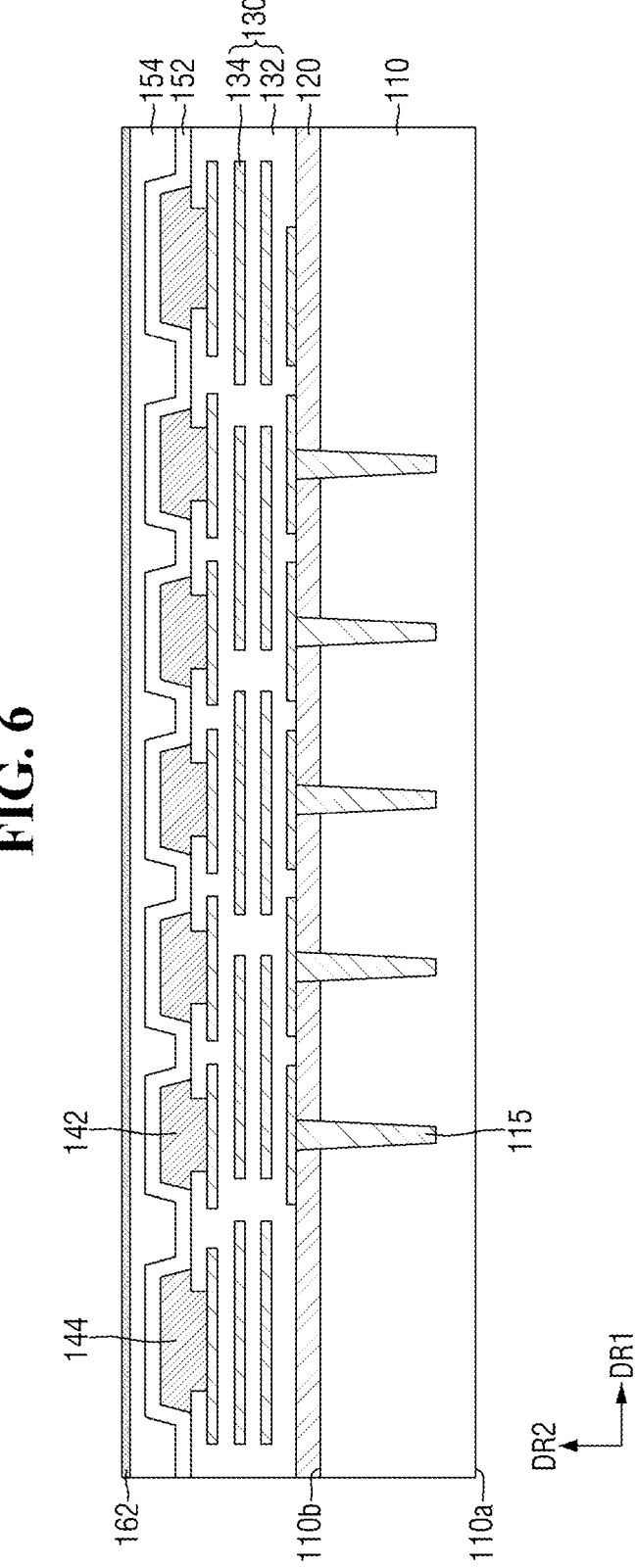

Referring to FIG. 6, the first interlayer insulating film 154 and the first liner film 162 may be sequentially formed on the first passivation film 152.

For example, the first interlayer insulating film 154 covering the first passivation film 152 may be formed. The first interlayer insulating film 154 may be formed by, e.g., plasma enhanced chemical vapor deposition (PECVD), low temperature chemical vapor deposition (LT CVD), or atomic layer deposition (ALD).

Subsequently, the first liner film 162 covering the first interlayer insulating film 154 may be formed. For example, a planarization process may be performed on the first interlayer insulating film 154 before the first liner film 162 is formed. The planarization process may include, e.g., a chemical mechanical polishing (CMP) process. Accordingly, the first liner film 162 may extend along the planarized upper surface of the first interlayer insulating film 154. The first liner film 162 may include, e.g., silicon nitride (SiN).

Figure 7:
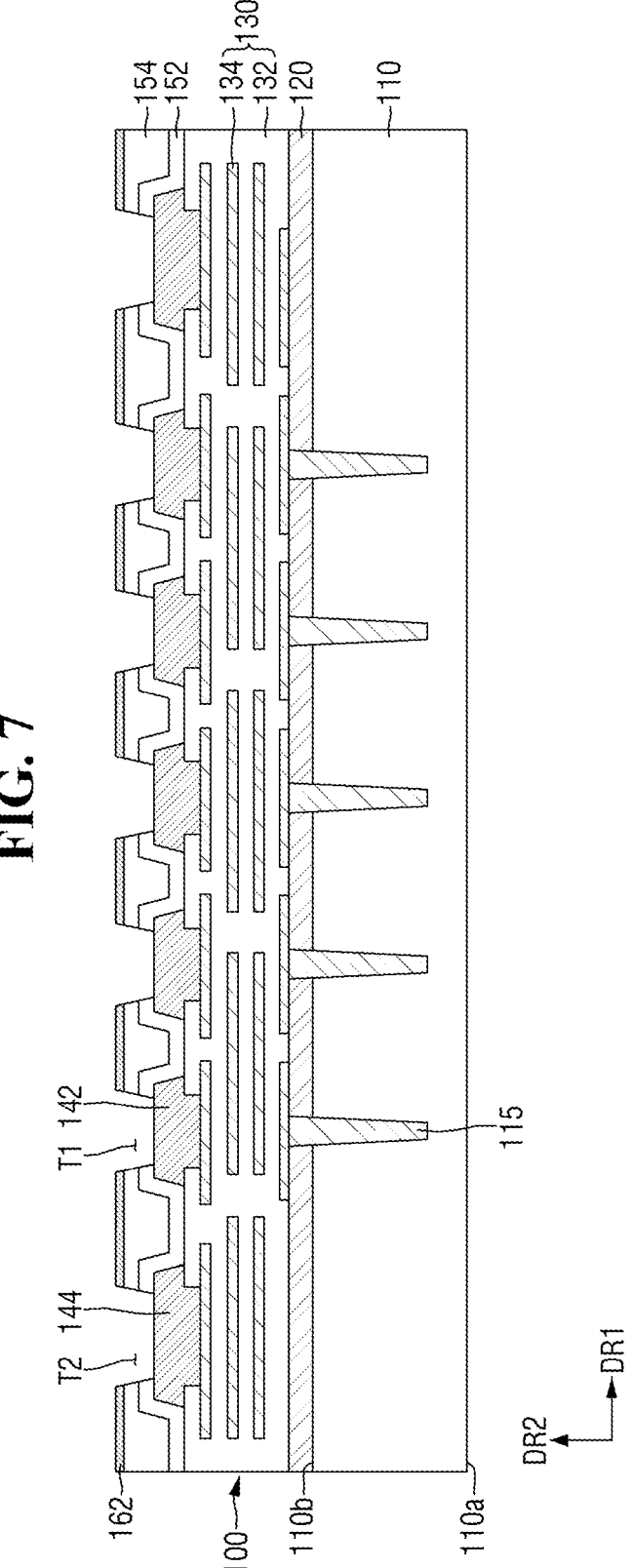

Referring to FIG. 7, each of first trenches T1 and second trenches T2 may be formed in the first passivation film 152, the first interlayer insulating film 154, and the first liner film 162. For example, the first trenches T1 and the second trenches T2 may be formed by etching the first passivation film 152, the first interlayer insulating film 154, and the first liner film 162 through a dry etching process. The first trench T1 may expose at least a portion of the upper surface of the first connection pad 142. In addition, the second trench T2 may expose at least a portion of the upper surface of the first test pad 144.

Figure 8:
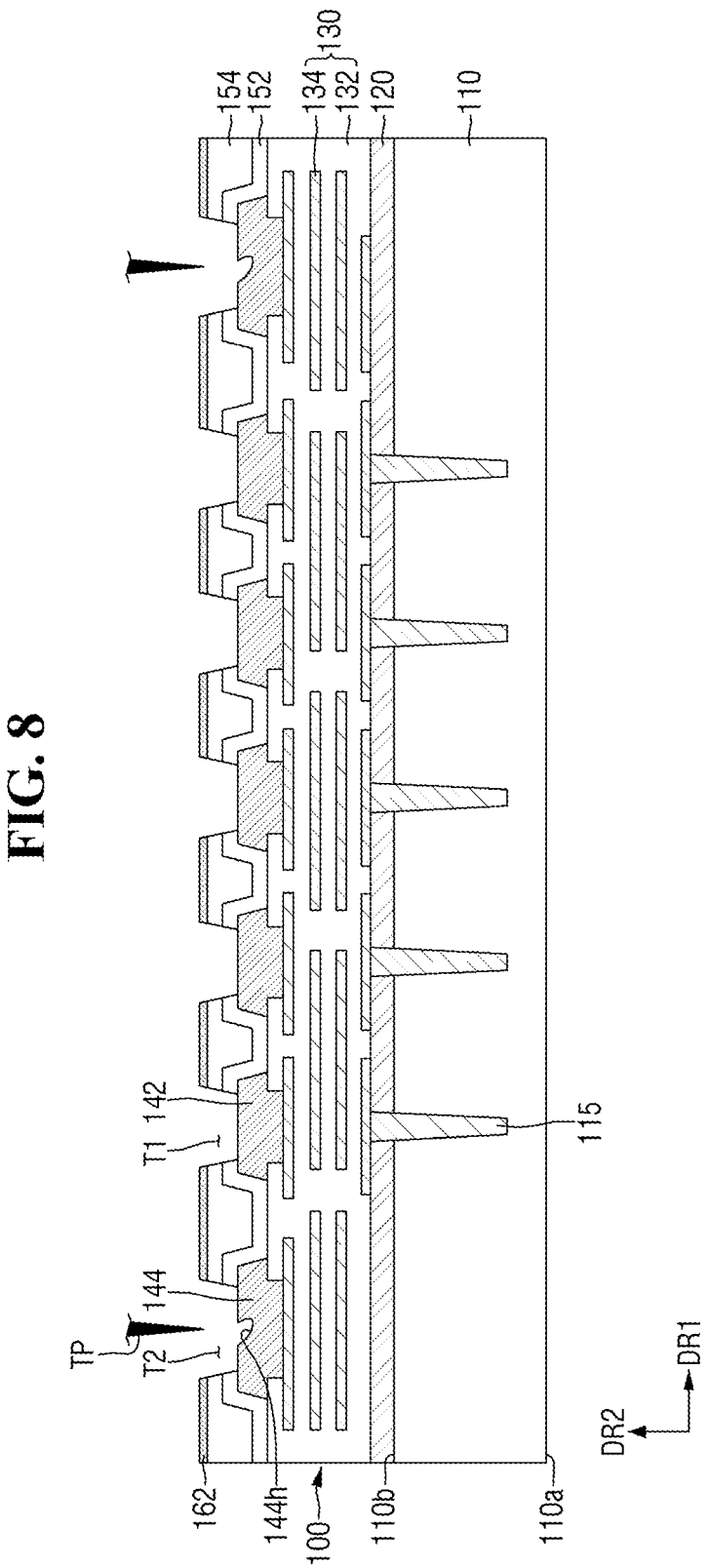

Referring to FIG. 8, a test process may be performed on the first test pad 144 through the second trench T2.

The test process may be performed in order to test a function and electrical connection of the first semiconductor chip 100. For example, a test equipment including a probe TP may be provided. The test equipment may perform the test process by bringing the probe TP into physical contact with the first test pad 144. Such a contact test process may have relatively high performance as compared with a contactless test process.

For example, the groove 144h may be formed in the exposed first test pad 144 of the second trench T2. As the probe TP comes into physical contact with the first test pad 144 in the test process, the groove 144h may be formed in the upper surface of the first test pad 144.

Figure 9:
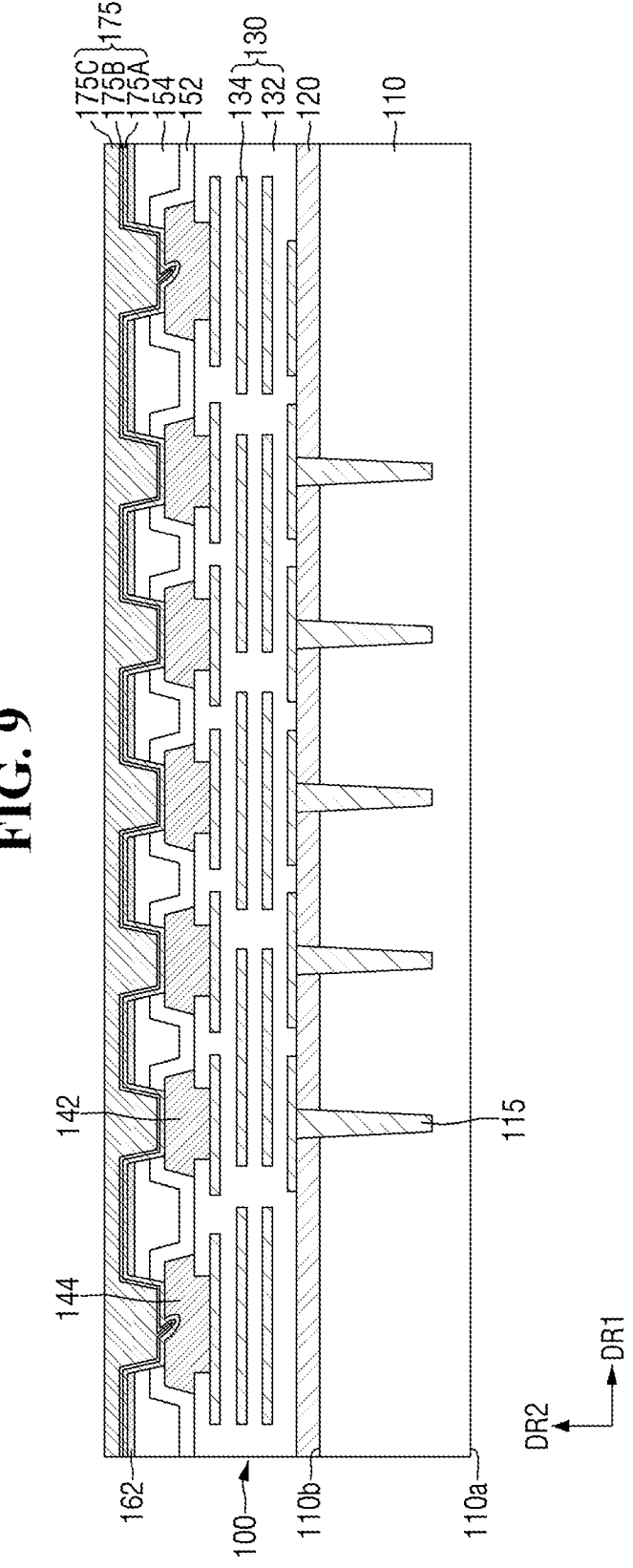

Referring to FIG. 9, a first pre-front bonding pad 175 may be formed inside the first and second trenches T1 and T2. Accordingly, the first front bonding pads 172 may be formed inside the first trenches T1. In addition, the first dummy pads 180 may be formed inside the second trenches T2 through the same process. For example, a first pre-metal layer 175A and a second pre-metal layer 175B may be formed sequentially and conformally on the first liner film 162 and in the first and second trenches T1 and T2, and a third pre-metal layer 175C may be formed on the second pre-metal layer 175B to fill the first and second trenches T1 and T2.

For example, when the first pre-metal layer 175A includes tantalum (Ta), the first pre-metal layer 175A may be a barrier layer. When the second pre-metal layer 175B and the third pre-metal layer 175C include copper (Cu), the second pre-metal layer 175B may be a copper seed layer, and the third pre-metal layer 175C may be a copper plating layer.

Figure 10:
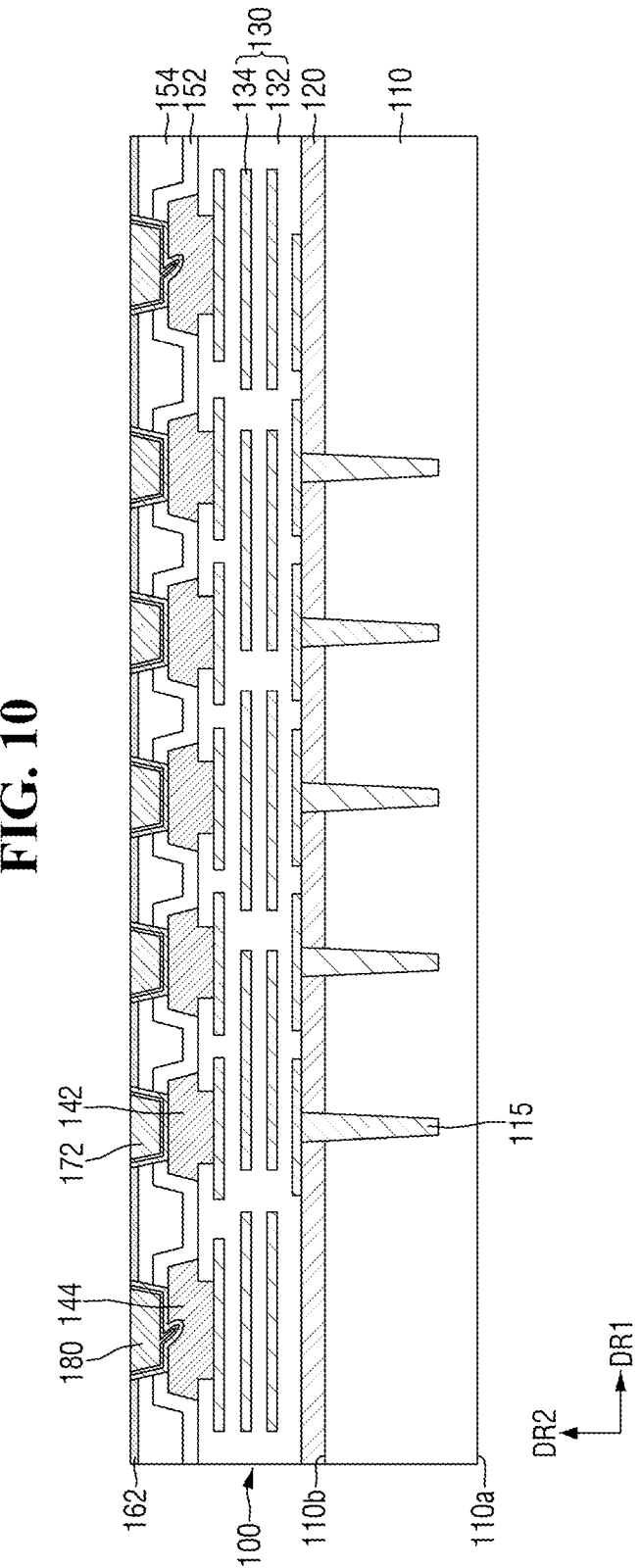

Referring to FIG. 10, the upper surfaces of the first front bonding pad 172 and the upper surfaces of the first dummy pad 180 may be exposed to be coplanar with each other and with the first liner film 162 by performing a planarization process. The planarization process may include, e.g., a chemical mechanical polishing (CMP) process.

Figure 11:
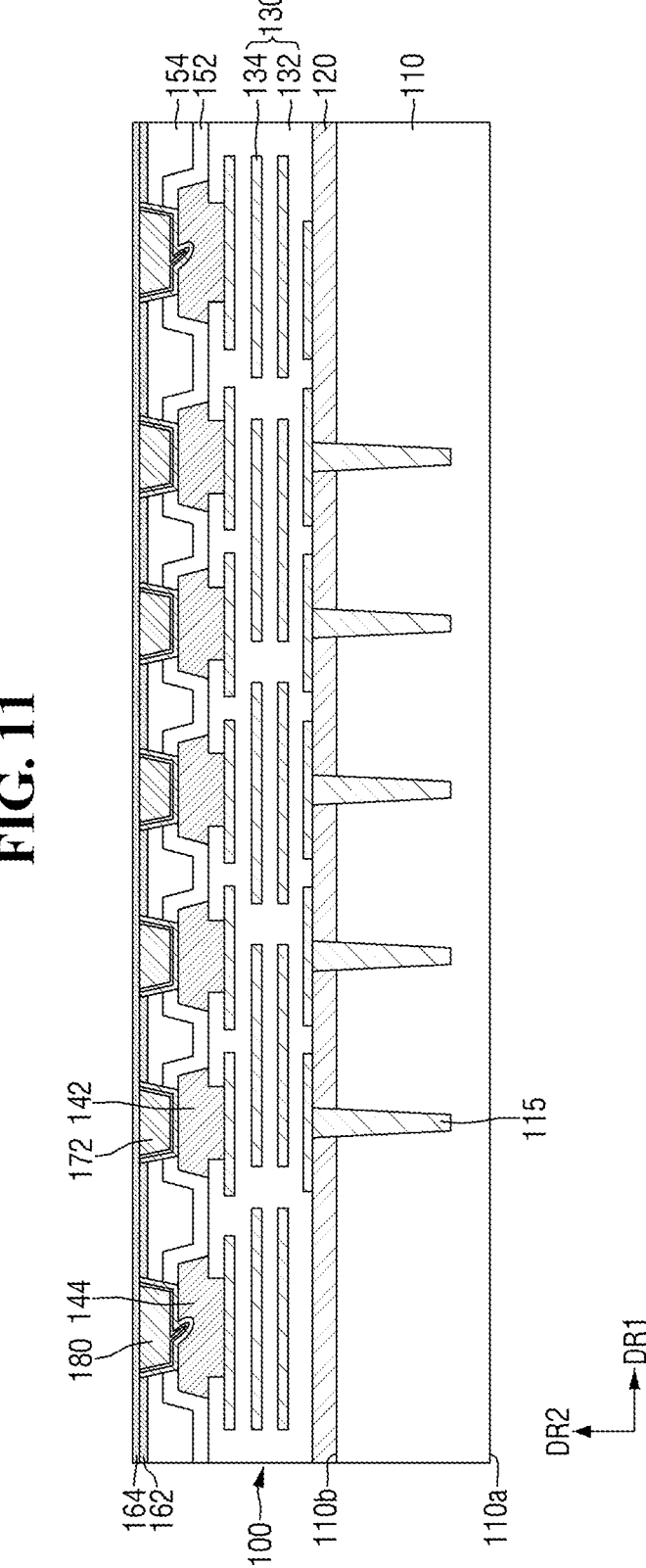

Referring to FIG. 11, the second liner film 164 may be formed on the first liner film 162. The second liner film 164 may be integrally, e.g., continuously, formed on the upper surface of the first front bonding pad 172 and the upper surface of the first dummy pad 180. The second liner film 164 may include, e.g., silicon carbonitride (SiCN).

Figure 12:
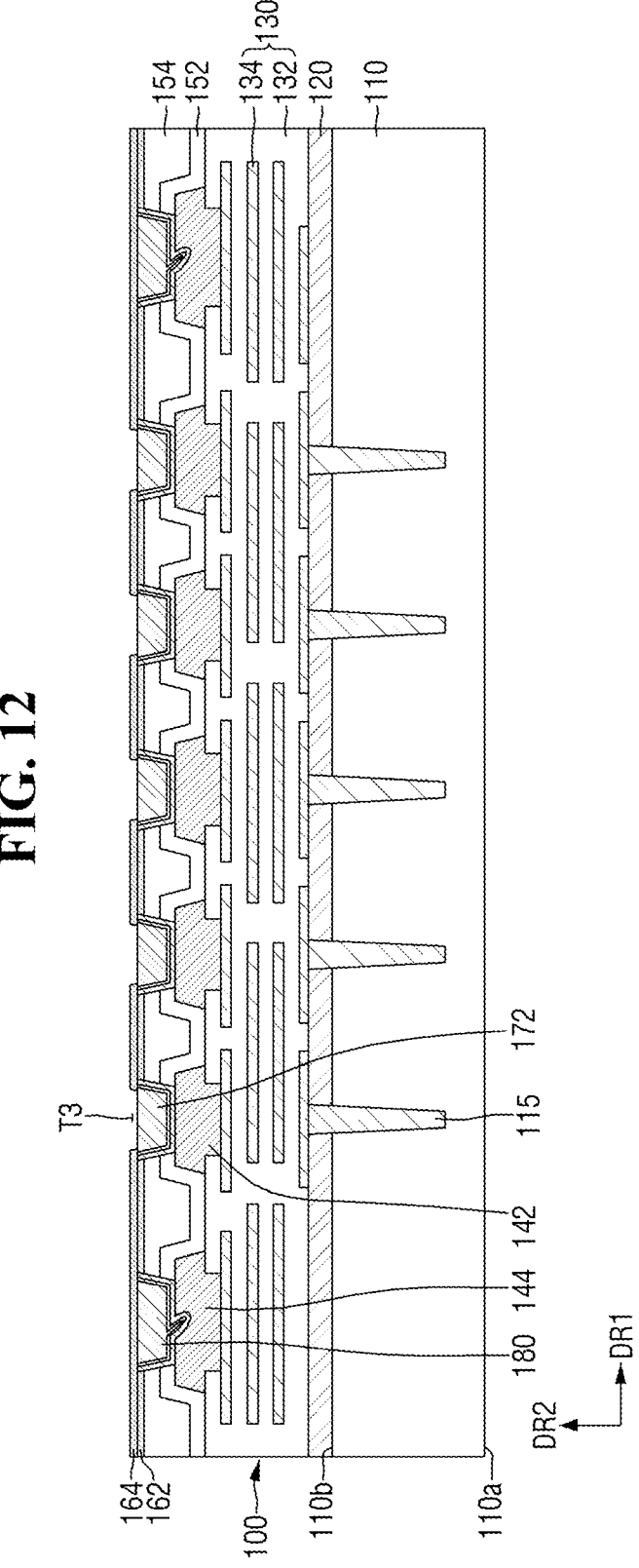

Referring to FIG. 12, third trenches T3 may be formed in the second liner film 164. For example, the third trenches T3 may be formed by etching the second liner film 164 through a dry etching process. The third trench T3 may expose at least a portion of the upper surface of the first front bonding pad 172. For example, as illustrated in FIG. 12, the third trench T3 may expose only the upper surface (e.g., or a portion of the upper surface) of the third pre-metal layer 175C, while upper surfaces of the first pre-metal layer 175A and the second pre-metal layer 175B remain covered by the second liner film 164.

Figure 13:
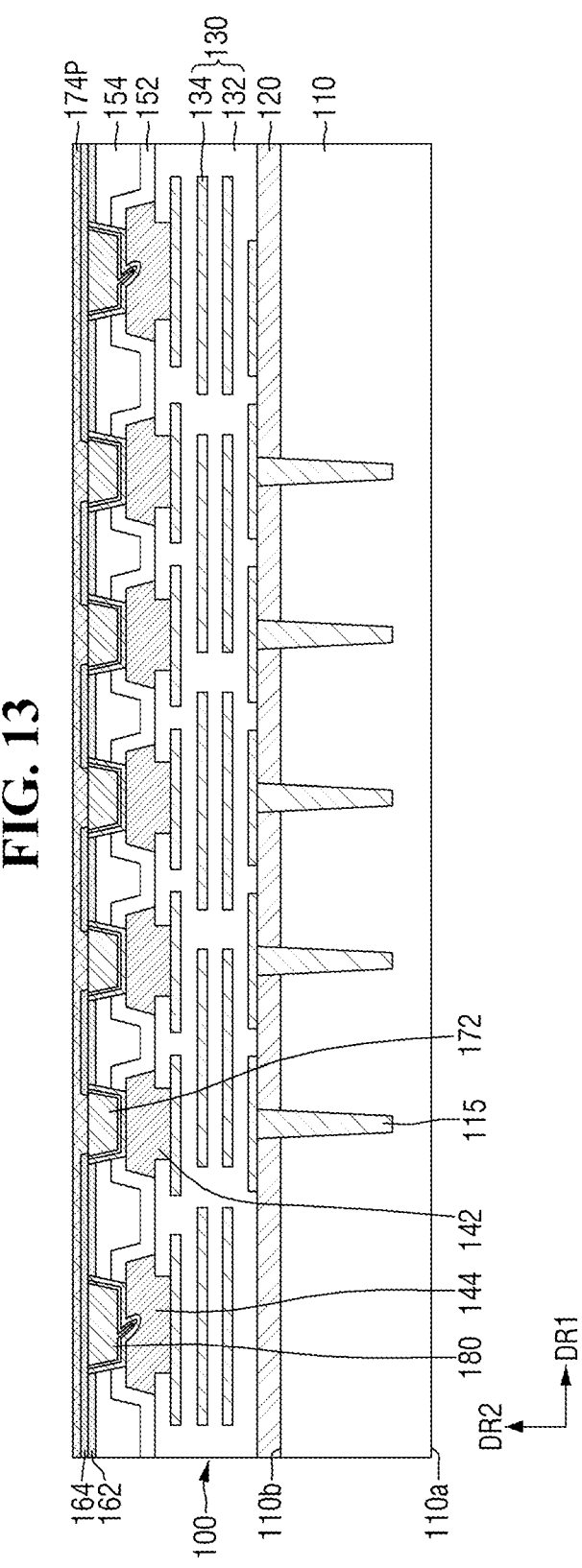

Referring to FIG. 13, a second pre-front bonding pad 174P may be formed inside the third trenches T3. For example, the second pre-front bonding pad 174P may include copper (Cu). In this case, the second pre-front bonding pad 174P may be formed by physical vapor deposition (PVD).

Figure 14:
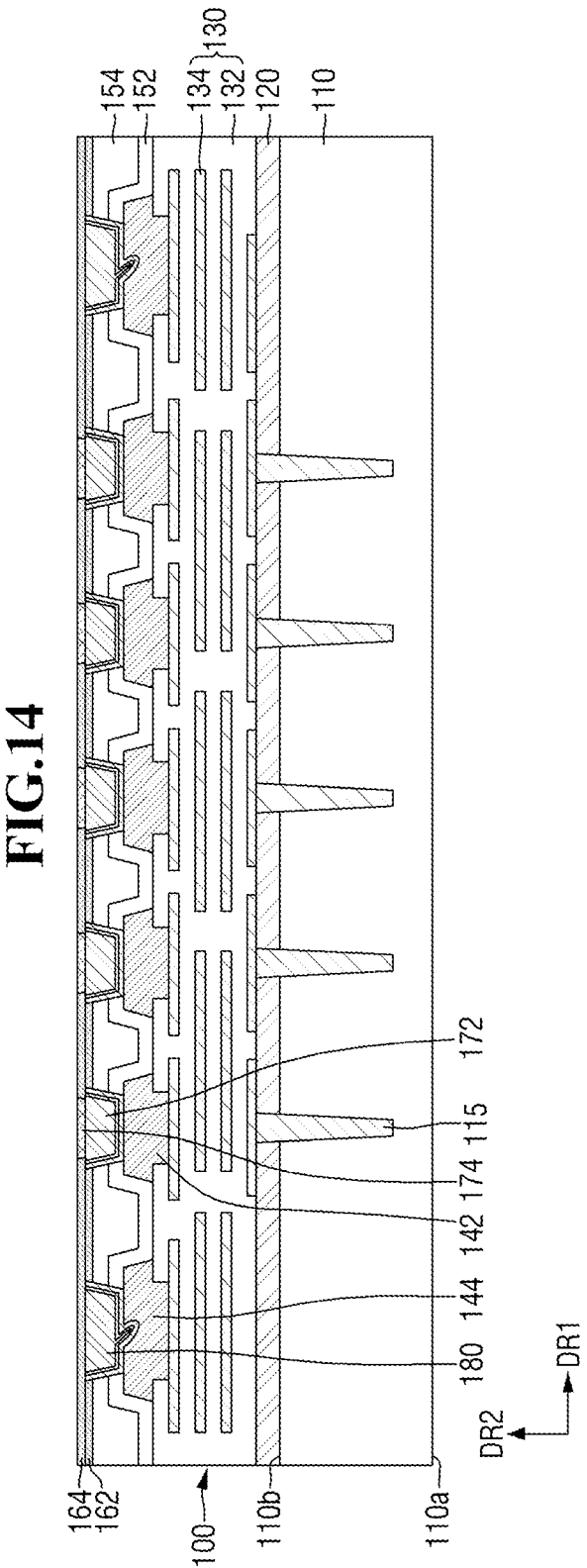

Referring to FIG. 14, by performing a planarization process, the upper surface of the second front bonding pad 174 may be formed on the same plane as (e.g., coplanar with) the upper surface of the second liner film 164. The planarization process may include, e.g., a chemical mechanical polishing (CMP) process.

Figure 15:
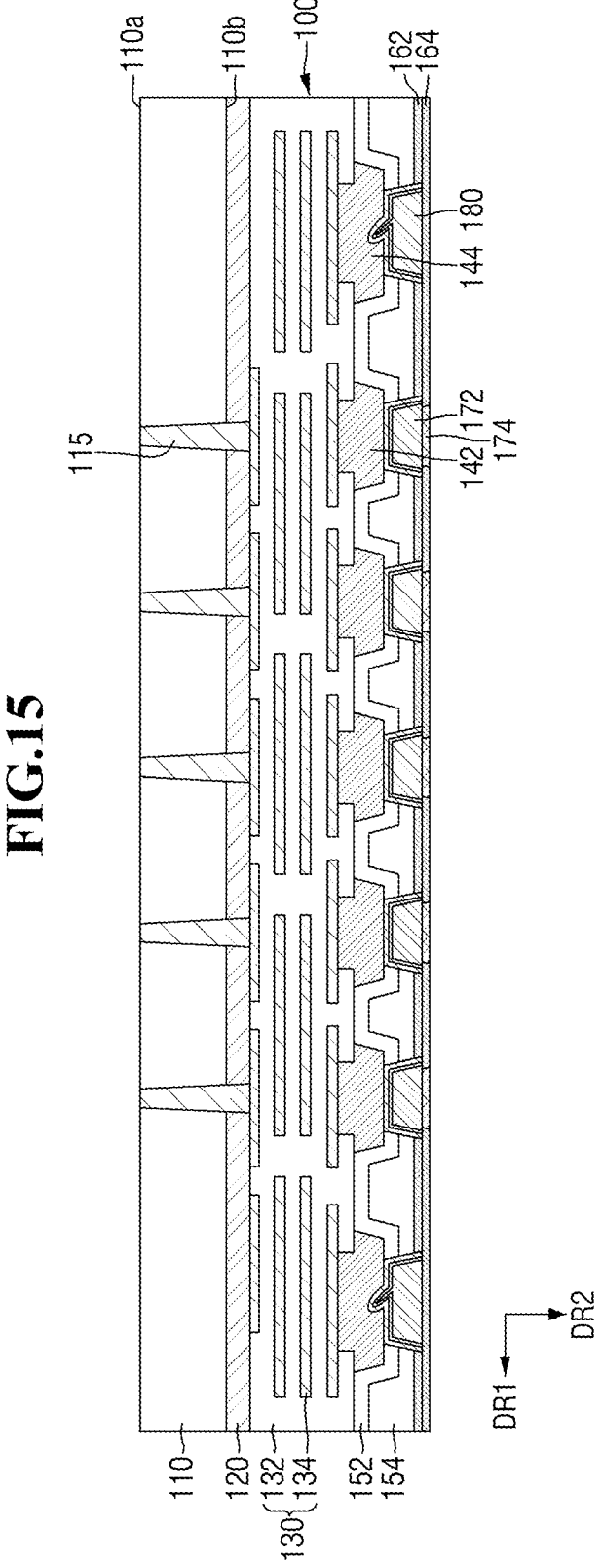

Referring to FIG. 15, a recess process is performed on the first surface 110a of the first semiconductor substrate 110. For example, a back grinding process may be performed on the first surface 110a of the first semiconductor substrate 110. Portions of the first through vias 115 may be exposed through the recess process. For example, the recess process may be performed until the first surface 110a of the first semiconductor substrate 110 becomes lower than upper surfaces of the first through vias 115. In this case, the first through vias 115 including protrusion portions protruding beyond the first surface 110a of the first semiconductor substrate 110 may be formed.

Subsequently, a planarization process may be performed on the first through vias 115 protruding beyond the first surface 110a of the first semiconductor substrate 110. The planarization process may include, e.g., a CMP process. Accordingly, the protrusion portions of the first through vias 115 protruding beyond the first surface 110a of the first semiconductor substrate 110 may be removed.

Figure 16:
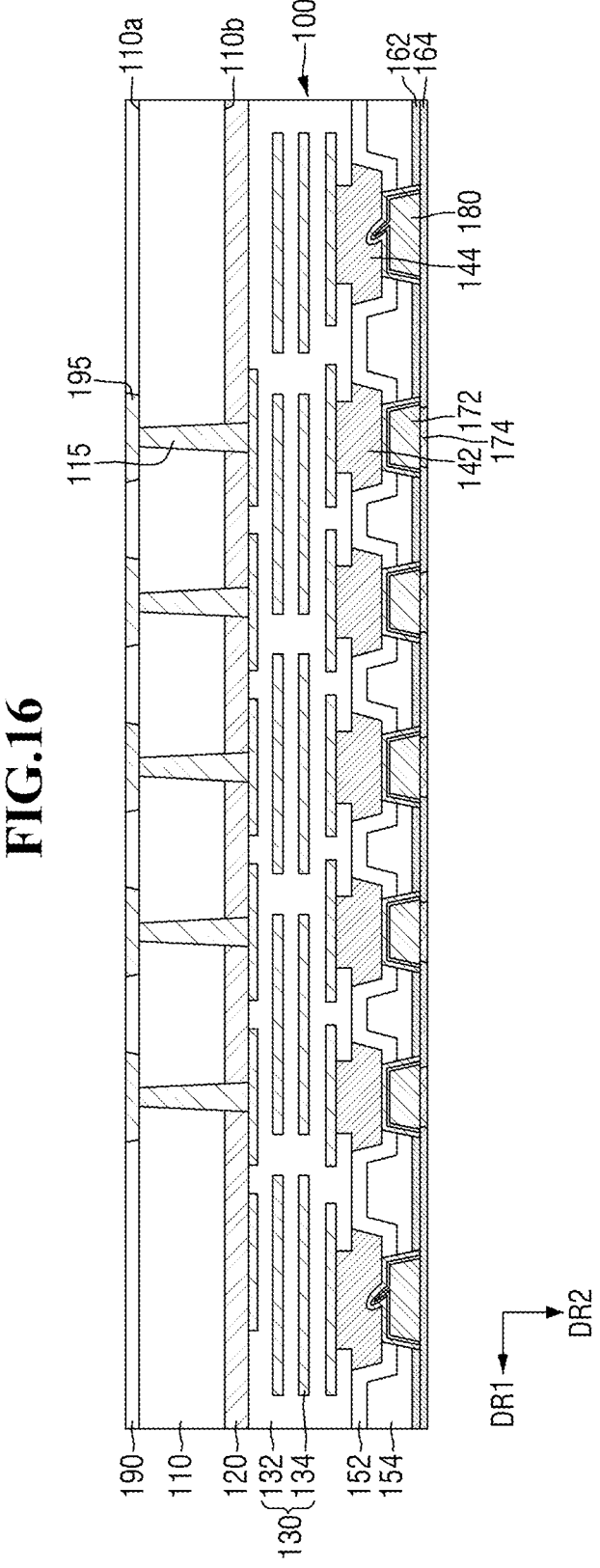

Referring to FIG. 16, the first back insulating film 190 may be formed on the first surface 110a of the first semiconductor substrate 110. Then, trenches exposing the first through vias 115 may be formed by etching the first back insulating film 190 through a dry etching process. Subsequently, the first back bonding pads 195 may be formed inside the trenches. For example, an upper surface of the first back bonding pad 195 may be formed on the same plane as (e.g., coplanar with) an upper surface of the first back insulating film 190. The first semiconductor chip 100 may be manufactured through such a manufacturing process.

Figure 17:
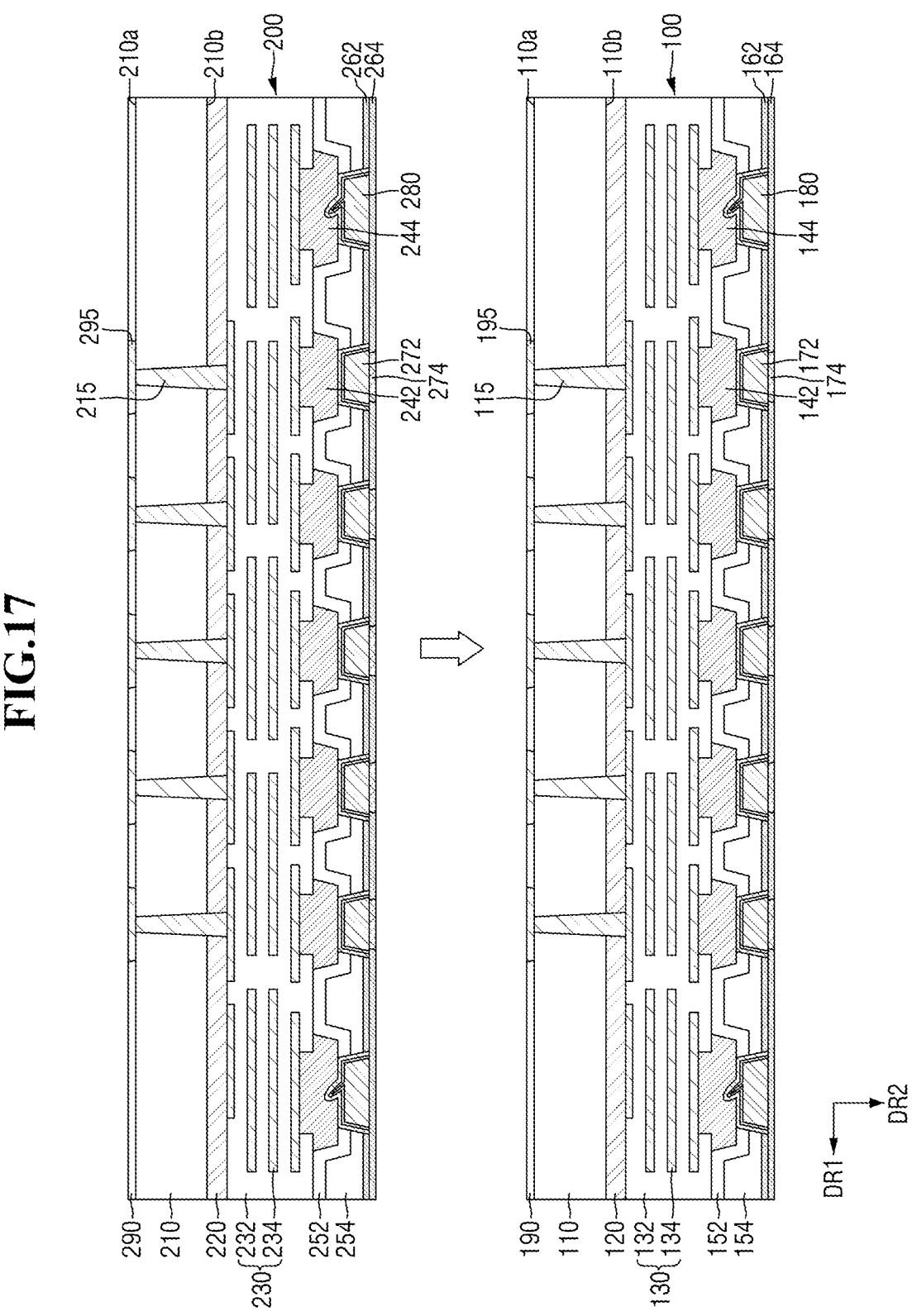

Referring to FIG. 17, the second semiconductor chip 200 manufactured through the same manufacturing process as the manufacturing process of the first semiconductor chip 100 may be provided. The first semiconductor chip 100 may be bonded onto the second semiconductor chip 200. The first semiconductor chip 100 and the second semiconductor chip 200 may be bonded to each other by a die to wafer (D2 W) method. For example, the second front bonding pad 174 of the first semiconductor chip 100 may be bonded to the second back bonding pad 295 of the second semiconductor chip 200. Accordingly, the first semiconductor chip 100 and the second semiconductor chip 200 may be electrically connected to each other. The semiconductor package illustrated in FIG. 1 may be manufactured through such a manufacturing process. The semiconductor package illustrated in FIG. 1 is illustrated in a state in which the semiconductor package manufactured through the manufacturing process illustrated in FIG. 17 is upside down.

Hereinafter, a semiconductor package according to some other exemplary embodiments of the present disclosure will be described with reference to FIGS. 1 and 18. Contents different from those of the semiconductor package illustrated in FIGS. 1 and 2 will be mainly described.

Figure 18:
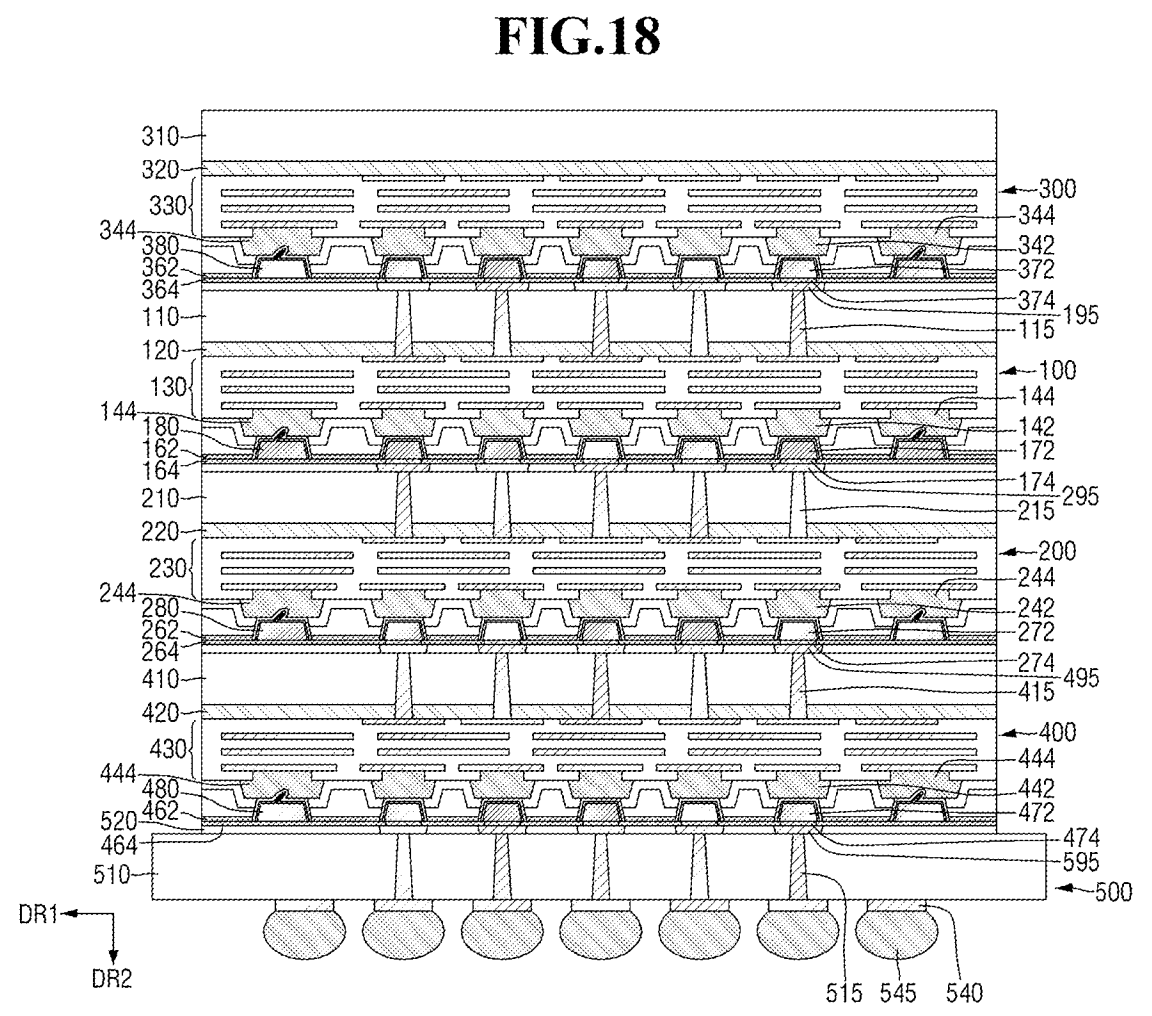

FIG. 18 is a schematic cross-sectional view for describing a semiconductor package according to some other exemplary embodiments of the present disclosure.

Referring to FIG. 18, a semiconductor package according to some other exemplary embodiments may include a base substrate 500 and a semiconductor chip stack with a plurality of s semiconductor chips 100, 200, 300, and 400.

The base substrate 500 may be a substrate for a package constituting a semiconductor package. As an example, the base substrate 500 may be a printed circuit board (PCB), a ceramic substrate, or an interposer. As another example, the base substrate 500 may be a substrate for a wafer level package (WLP) manufactured at a wafer level. As still another example, the base substrate 500 may be a semiconductor chip including semiconductor elements. It will hereinafter be described by way of example that the base substrate 500 is a semiconductor chip including a base semiconductor substrate 510.

The semiconductor chip stack may include a plurality of semiconductor chips (e.g., first to fourth semiconductor chips 100, 200, 300, and 400) that are mutually stacked. For example, as illustrated in FIG. 18, the second semiconductor chip 200 may be stacked on the fourth semiconductor chip 400, the first semiconductor chip 100 may be stacked on the second semiconductor chip 200, and the third semiconductor chip 300 may be stacked on the first semiconductor chip 100. The semiconductor chips 100, 200, 300, and 400 may constitute a multi-chip semiconductor package, e.g., a high bandwidth memory (HBM).

The respective semiconductor chips (e.g., the first to fourth semiconductor chips) of the semiconductor chips 100, 200, 300, and 400 may include, respectively, semiconductor substrates 110, 210, 310, and 410, through vias 115, 215, 415, and 515, semiconductor element layers 120, 220, 320, and 420, wiring structures 130, 230, 330, and 430, connection pads 142, 242, 342, and 442, test pads 144, 244, 344, and 444, dummy pads 180, 280, 380, and 480, first liner films 162, 262, 362, and 462, second liner films 164, 264, 364, and 464, first front bonding pads 172, 272, 372, and 472, second front bonding pads 174, 274, 374, and 474, and back bonding pads 195, 295, and 495. These components may correspond to the first semiconductor substrate 110, the first through vias 115, the first semiconductor element layer 120, the first wiring structure 130, the first connection pads 142, the first test pads 144, the first dummy pads 180, the first liner film 162, the second liner film 164, the first front bonding pads 172, and the first back bonding pads 195 described above in relation to the first semiconductor chip 100, respectively. Thus, a detailed description thereof will hereinafter be omitted.

The semiconductor chips 100, 200, 300, and 400 may be stacked on the base substrate 500. For example, first base pads 595 may be formed on an upper surface of the base semiconductor substrate 510. The fourth semiconductor chip 400 may be electrically connected to the base substrate 500 through the first base pads 595 in a buffer insulating film 520. For example, first front bonding pads 472 of the fourth semiconductor chip 400 may be connected to the first base pads 595 of the base substrate 500.

In some other exemplary embodiments, the base substrate 500 may further include base through vias 515, second base pads 540, and base connection members 545. The second base pad 540 may be formed on a lower surface of the base semiconductor substrate 510. The base through via 515 may penetrate through the base semiconductor substrate 510 to connect the first base pad 595 and the second base pad 540 to each other. The base connection member 545 may be connected to the second base pad 540. The semiconductor package according to some other exemplary embodiments may be electrically connected to an external device (e.g., a panel of an electronic device, etc.) through the base connection members 545. The base connection member 545 may include, e.g., at least one of a solder ball, a bump, an under bump metallurgy (UBM), and combinations thereof. For example, the base connection member 545 may include a metal, e.g., tin (Sn).

The first front bonding pads 172, 272, 372, and 472 may be connected to the connection pads 142, 242, 342, and 442, respectively, and may not be connected to the test pads 144, 244, 344, and 444, respectively. The second front bonding pads 174, 274, 374, and 474 may be connected to the connection pads 142, 242, 342, and 442, respectively, and may not be connected to the test pads 144, 244, 344, and 444, respectively. The dummy pads 180, 280, 380, and 480 may be connected to the test pads 144, 244, 344, and 444, respectively, and may not be connected to the connection pads 142, 242, 342, and 442, respectively.

Only portions of upper surfaces of the first front bonding pads 172, 272, 372, and 472 may be in contact with the second liner films 164, 264, 364, and 464, respectively. The entirety of upper surfaces of the dummy pads 180, 280, 380, and 480 may be in contact (e.g., direct contact) with the second liner films 164, 264, 364, and 464, respectively.

For example, as illustrated in FIG. 18, four semiconductor chips 100, 200, 300, and 400 are stacked on the upper surface of the base semiconductor substrate 510. In another example, five or more semiconductor chips may be stacked on the upper surface of the base semiconductor substrate 510.

Hereinafter, a semiconductor package according to some other exemplary embodiments of the present disclosure will be described with reference to FIG. 19. Contents different from those of the semiconductor package illustrated in FIG. 18 will be mainly described.

Figure 19:
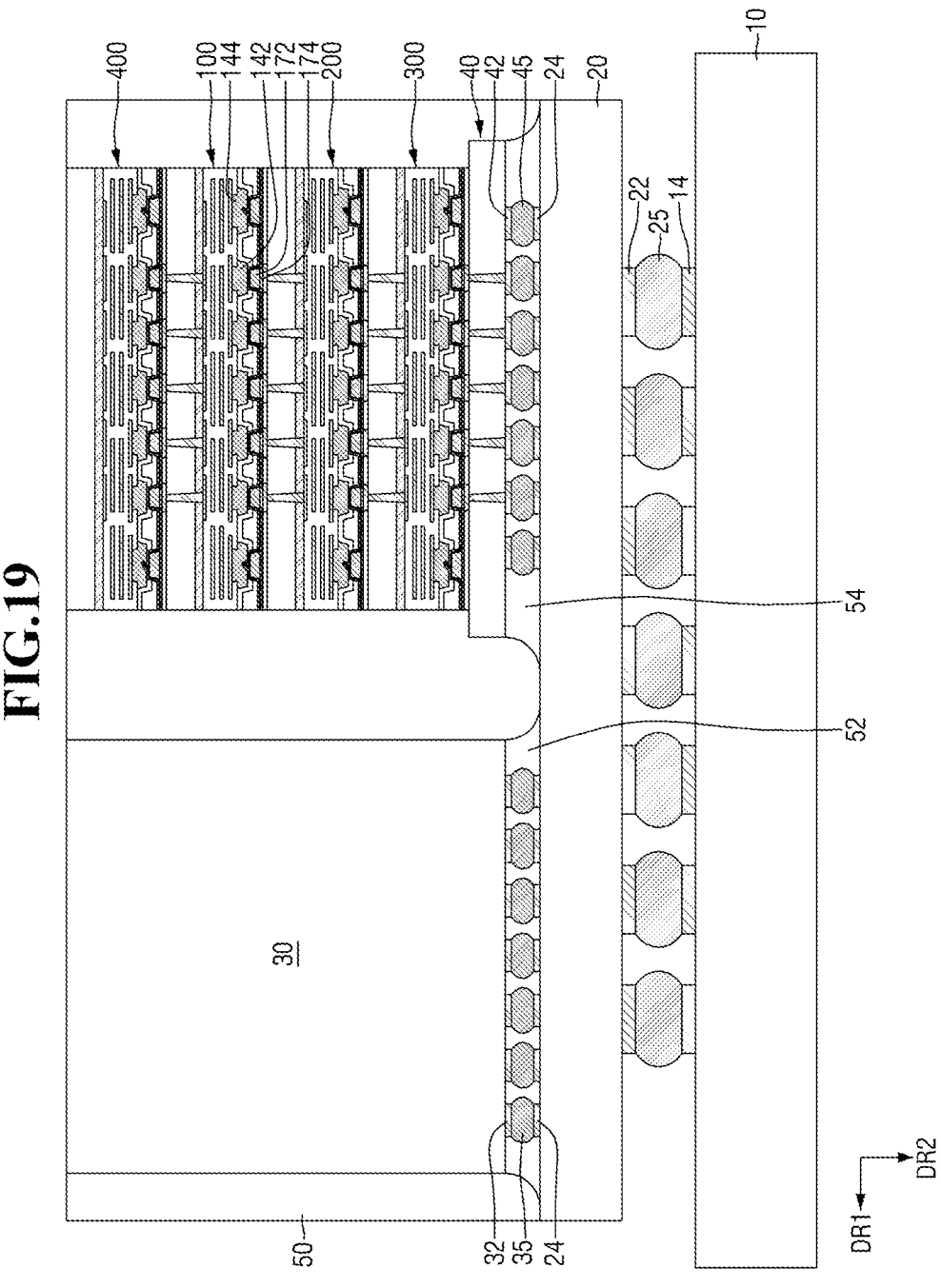
FIG. 19 is a schematic cross-sectional view of a semiconductor package according to some other exemplary embodiments of the present disclosure.

FIG. 19 is a schematic cross-sectional view for describing a semiconductor package according to some other exemplary embodiments of the present disclosure.

Referring to FIG. 19, in a semiconductor package according to some other exemplary embodiments of the present disclosure, the semiconductor package illustrated in FIG. 18 may be disposed on an interposer 20.

The interposer 20 may be stacked on a printed circuit board 10. The interposer 20 may be electrically connected to the printed circuit board 10. For example, substrate pads 14 may be formed on an upper surface of the printed circuit board 10 and first interposer pads 22 may be formed on a lower surface of the interposer 20. The substrate pads 14 and the first interposer pads 22 may be connected to each other through first connection members 25. The first connection member 25 may include, e.g., at least one of a solder ball, a bump, an under bump metallurgy (UBM), and combinations thereof. For example, the first connection member 25 may include a metal, e.g., tin (Sn).

The interposer 20 may be interposed between the printed circuit board 10 and the semiconductor chips 100, 200, 300, and 400. The semiconductor chips 100, 200, 300, and 400 may be stacked on an upper surface of the interposer 20. The interposer 20 may be a silicon interposer or an organic interposer. In some other exemplary embodiments, the interposer 20 may include a silicon interposer. The interposer 20 may be used to facilitate connection between a logic semiconductor chip 30 and the semiconductor chips 100, 200, 300, and 400 and reduce warpage of the semiconductor package.

The logic semiconductor chip 30 may be an integrated circuit (IC) provided in an amount of several hundred to several million or more semiconductor elements integrated in a single chip. For example, the logic semiconductor chip 30 may be an application processor (AP), e.g., a central processing unit (CPU), a graphic processing unit (GPU), a field-programmable gate array (FPGA), a digital signal processor, an encryption processor, a microprocessor, a microcontroller, or an application-specific integrated circuit (ASIC).

The logic semiconductor chip 30 may be mounted on the upper surface of the interposer 20. For example, second interposer pads 24 may be formed on the upper surface of the interposer 20, and first chip pads 32 may be formed on a lower surface of the logic semiconductor chip 30. In addition, the second interposer pads 24 and the first chip pads 32 may be connected to each other through second connection members 35. The second connection member 35 may include, e.g., at least one of a micro bump, an under bump metallurgy (UBM), and combinations thereof. For example, the second connection member 35 may include a metal, e.g., tin (Sn).

In some other exemplary embodiments, a first underfill 52 may be formed between the interposer 20 and the logic semiconductor chip 30. The first underfill 52 may fill a space between the interposer 20 and the logic semiconductor chip 30. In addition, the first underfill 52 may cover the second connection members 35. The first underfill 52 may prevent the logic semiconductor chip 30 from being broken by fixing the logic semiconductor chip 30 onto the interposer 20. For example, the first underfill 52 may include an insulating polymer material, e.g., an epoxy molding compound (EMC).

The semiconductor chips 100, 200, 300, and 400 may constitute a multi-chip semiconductor package, e.g., a high bandwidth memory (HBM). In some other exemplary embodiments, a buffer semiconductor chip 40 may be interposed between the interposer 20 and the semiconductor chips 100, 200, 300, and 400. The buffer semiconductor chip 40 may be used to facilitate connection between the interposer 20 and the semiconductor chips 100, 200, 300, and 400 and connection between the logic semiconductor chip 30 and the semiconductor chips 100, 200, 300, and 400.

For example, the buffer semiconductor chip may be an application processor (AP), e.g., a central processing unit (CPU), a graphic processing unit (GPU), a field-programmable gate array (FPGA), a digital signal processor, an encryption processor, a microprocessor, a microcontroller, or an application-specific integrated circuit (ASIC).

The buffer semiconductor chip 40 may be spaced apart from the logic semiconductor chip 30 and may be mounted on the upper surface of the interposer 20. For example, second chip pads 42 may be formed on a lower surface of the buffer semiconductor chip 40. In addition, the second interposer pads 24 and the second chip pads 42 may be connected to each other through third connection members 45. The third connection member 45 may include, e.g., at least one of a micro bump, an under bump metallurgy (UBM), and combinations thereof. For example, the third connection member 45 may include a metal, e.g., tin (Sn).

In some other exemplary embodiments, a second underfill 54 may be formed between the interposer 20 and the buffer semiconductor chip 40. The second underfill 54 may fill a space between the interposer 20 and the buffer semiconductor chip 40. In addition, the second underfill 54 may cover the third connection members 45. The second underfill 54 may prevent the buffer semiconductor chip 40 from being broken by fixing the buffer semiconductor chip 40 onto the interposer 20. For example, the second underfill 54 may include an insulating polymer material, e.g., an EMC.

A molding member 50 may be formed on the upper surface of the interposer 20. The molding member 50 may cover at least a portion of the logic semiconductor chip 30 and at least portions of the semiconductor chips 100, 200, 300, and 400. For example, the molding member 50 may cover side surfaces of the logic semiconductor chip 30 and side surfaces of the semiconductor chips 100, 200, 300, and 400. For example, as illustrated in FIG. 19, the molding member 50 may expose an upper surface of the logic semiconductor chip 30 and upper surfaces of the semiconductor chips 100, 200, 300, and 400. In another example, the molding member 50 may also cover the upper surface of the logic semiconductor chip 30 and the upper surfaces of the semiconductor chips 100, 200, 300, and 400.

For example, the molding member 50 may include an insulating polymer material, e.g., an EMC. In some other exemplary embodiments, the first underfill 52 and the second underfill 54 may include a material different from that of the molding member 50. For example, each of the first underfill 52 and the second underfill 54 may include an insulating material having fluidity more excellent than that of the molding member 50. Accordingly, the first underfill 52 and the second underfill 54 may efficiently fill narrow spaces between the interposer 20 and the logic semiconductor chip 30 and/or between the interposer 20 and the semiconductor chips 100, 200, 300, and 400, respectively.

By way of summation and review, aspects of the present disclosure provide a semiconductor package with improved reliability. That is, according to example embodiments, peeling (e.g., separation) of the first metal layer 172A from the second metal layer 172B due to their different materials (e.g., Ta and Cu) may be prevented or substantially reduced by passivating (e.g., completely covering) their upper surfaces via the second liner film 164 (e.g., a SiCN layer).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a first semiconductor substrate including a first surface and a second surface opposing the first surface;
a first semiconductor element layer on the second surface of the first semiconductor substrate;
a first wiring structure on the first semiconductor element layer;
a first connection pad on the first wiring structure and connected to the first wiring structure;
a first test pad on the first wiring structure, connected to the first wiring structure, and spaced apart from the first connection pad in a horizontal direction;
a first liner film on the first wiring structure and having a first bonding pad trench therein;
a second liner film on the first liner film and having a second bonding pad trench therein;

a first front bonding pad including a barrier layer and a first metal layer on the barrier layer, the barrier layer extending along sidewalls and a bottom surface of the first bonding pad trench and being in contact with the first liner film, and the second liner film integrally covering an upper surface of the barrier layer and an upper surface of the first metal layer; and
a second front bonding pad filling an inner portion of the second bonding pad trench and in contact with the second liner film.

2. The semiconductor package as claimed in claim 1, further comprising:
a first dummy pad trench spaced apart from the first bonding pad trench in the horizontal direction in the first liner film, and
a first dummy pad inside the first dummy pad trench and connected to the first test pad.

3. The semiconductor package as claimed in claim 2, wherein an upper surface of the first front bonding pad is coplanar with an upper surface of the first dummy pad.

4. The semiconductor package as claimed in claim 2, wherein the first dummy pad includes a dummy barrier layer and a first dummy metal layer on the dummy barrier layer, the dummy barrier layer extending along sidewalls and a bottom surface of the first dummy pad trench and being in contact with the first liner film.

5. The semiconductor package as claimed in claim 1, wherein:
an upper surface of the first liner film is on coplanar with an upper surface of the first front bonding pad,
an upper surface of the second liner film is coplanar with an upper surface of the second front bonding pad, and
the second liner film covers the upper surface of the first liner film.

6. The semiconductor package as claimed in claim 1, wherein a width of the first front bonding pad in the horizontal direction is greater than a width of the second front bonding pad in the horizontal direction.

7. The semiconductor package as claimed in claim 1, wherein:
the first front bonding pad further includes a second metal layer on the first metal layer so as to fill an inner portion of the first bonding pad trench, and
sidewalls of the second front bonding pad are misaligned with sidewalls of the second metal layer.

8. The semiconductor package as claimed in claim 1, wherein:
the first front bonding pad further includes a second metal layer on the first metal layer so as to fill an inner portion of the first bonding pad trench, and
sidewalls of the second front bonding pad are aligned with sidewalls of the second metal layer.

9. The semiconductor package as claimed in claim 1, further comprising:
a second semiconductor substrate on the second front bonding pad, the second semiconductor substrate including a first surface facing the second front bonding pad and a second surface opposing the first surface;
a second semiconductor element layer on the second surface of the second semiconductor substrate;
a second wiring structure on the second semiconductor element layer;
a second connection pad on the second wiring structure and connected to the second wiring structure;

a second test pad on the second wiring structure, connected to the second wiring structure, and spaced apart from the second connection pad in the horizontal direction;

a third front bonding pad on the second connection pad and connected to the second connection pad; and a fourth front bonding pad on the third front bonding pad and connected to the third front bonding pad.

10. A semiconductor package, comprising:

a semiconductor substrate including a first surface and a second surface opposing the first surface;

a semiconductor element layer on the second surface of the semiconductor substrate;

a wiring structure on the semiconductor element layer;

a connection pad on the wiring structure and connected to the wiring structure;

a test pad on the wiring structure, connected to the wiring structure, and spaced apart from the connection pad in a horizontal direction;

a first liner film on the wiring structure and having a dummy pad trench and a first bonding pad trench therein, the dummy pad trench exposing the test pad and the first bonding pad trench exposing the connection pad;

a second liner film on the first liner film so as to cover an upper surface of the first liner film, the second liner film having a second bonding pad trench therein;

a first front bonding pad inside the first bonding pad trench and in contact with the first liner film;

a second front bonding pad inside the second bonding pad trench and in contact with the second liner film; and a dummy pad inside the dummy pad trench, wherein an upper surface of the first front bonding pad includes a first area in contact with the second liner film and a second area in contact with the second front bonding pad, and wherein an entirety of an upper surface of the dummy pad is in contact with the second liner film.

11. The semiconductor package as claimed in claim 10, wherein:

the first front bonding pad includes first and second metal layers along sidewalls and a bottom surface of the first bonding pad trench and a third metal layer on the second metal layer so as to fill an inner portion of the first bonding pad trench, and an entirety of each of upper surfaces of the first and second metal layers is in contact with the second liner film, and a portion of an upper surface of the third metal layer is in contact with the second liner film.

12. The semiconductor package as claimed in claim 11, wherein a width of the upper surface of the third metal layer in the horizontal direction is greater than a width of the second front bonding pad in the horizontal direction.

13. The semiconductor package as claimed in claim 11, wherein the second front bonding pad includes a metal material different from that of the first metal layer.

14. The semiconductor package as claimed in claim 10, wherein:

the dummy pad includes first and second dummy metal layers along sidewalls and a bottom surface of the dummy pad trench and a third dummy metal layer on the second dummy metal layer so as to fill an inner portion of the dummy pad trench, and an entirety of each of upper surfaces of the first to third dummy metal layers is in contact with the second liner film.

15. The semiconductor package as claimed in claim 10, wherein a width of the dummy pad in the horizontal direction is greater than a width of the first front bonding pad in the horizontal direction.

16. The semiconductor package as claimed in claim 10, wherein the second front bonding pad is not on the test pad.

17. A semiconductor package, comprising:

a base substrate; and semiconductor chips sequentially stacked on the base substrate, each of the semiconductor chips including:

a semiconductor substrate including a first surface facing an upper surface of the base substrate and a second surface opposing the first surface;

a semiconductor element layer and a wiring structure sequentially stacked on the first surface of the semiconductor substrate;

a connection pad and a test pad each connected to the wiring structure and each exposed from the wiring structure;

a first liner film on the wiring structure;

a second liner film on the first liner film so as to cover an upper surface of the first liner film;

a first front bonding pad within the first liner film, connected to the connection pad, and not connected to the test pad, only a portion of an upper surface of the first front bonding pad being in contact with the second liner film;

a second front bonding pad within the second liner film, connected to the connection pad, and not connected to the test pad;

a back bonding pad on the second surface of the semiconductor substrate; and a through via penetrating through the semiconductor substrate to connect the wiring structure and the back bonding pad to each other.

18. The semiconductor package as claimed in claim 17, wherein a width of the first front bonding pad in a horizontal direction is greater than a width of the second front bonding pad in the horizontal direction.

19. The semiconductor package as claimed in claim 17, wherein:

each of the semiconductor chips further includes a dummy pad connected to the test pad and not connected to the connection pad, and an entirety of an upper surface of the dummy pad is in contact with the second liner film.

20. The semiconductor package as claimed in claim 19, wherein the second front bonding pad is not on the dummy pad.

* * * * *